US012751047B2

(12) United States Patent
Lee et al.

(10) Patent No.: US 12,751,047 B2
(45) Date of Patent: Sep. 29, 2026

(54) SEMICONDUCTOR DEVICE INCLUDING INTERFACIAL LAYER WITH CET SCALING AND METHOD FOR MANUFACTURING THE SAME

(71) Applicant: TAIWAN SEMICONDUCTOR MANUFACTURING COMPANY, LTD., Hsinchu (TW)

(72) Inventors: Shen-Yang Lee, Hsinchu (TW); Hsiang-Pi Chang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 368 days.

(21) Appl. No.: 18/520,105

(22) Filed: Nov. 27, 2023

(65) Prior Publication Data

US 2025/0176213 A1 May 29, 2025

(51) Int. Cl.

| | |
|---|---|
| ***H10D 30/67*** | (2025.01) |
| ***H10D 30/01*** | (2025.01) |
| ***H10D 30/43*** | (2025.01) |
| ***H10D 62/10*** | (2025.01) |
| ***H10D 64/01*** | (2025.01) |
| ***H10D 84/01*** | (2026.01) |
| ***H10D 84/03*** | (2025.01) |
| ***H10D 84/85*** | (2025.01) |

(52) U.S. Cl.
CPC ....... *H10D 30/6735* (2025.01); *H10D 30/014* (2025.01); *H10D 30/43* (2025.01); *H10D 30/6757* (2025.01); *H10D 62/121* (2025.01); *H10D 64/017* (2025.01); *H10D 84/0167* (2025.01); *H10D 84/038* (2025.01); *H10D 84/85* (2025.01)

(58) Field of Classification Search
CPC ............. H10D 30/6735; H10D 64/017; H10D 84/8314; H10D 30/019; H10D 30/501; H10D 84/851
See application file for complete search history.

(56) References Cited

U.S. PATENT DOCUMENTS

| | | | | |
|---|---|---|---|---|
| 2002/0145168 | A1* | 10/2002 | Bojarczuk, Jr. | H10P 14/6933 257/388 |
| 2016/0093616 | A1* | 3/2016 | Lai | H10D 64/01318 257/369 |
| 2021/0305400 | A1* | 9/2021 | Hsu | H10D 64/017 |
| 2024/0186393 | A1* | 6/2024 | Bao | H10D 30/6735 |
| 2024/0204103 | A1* | 6/2024 | Galatage | H10D 30/62 |

* cited by examiner

*Primary Examiner* — Nduka E Ojeh
(74) *Attorney, Agent, or Firm* — Birch, Stewart, Kolasch & Birch, LLP

(57) ABSTRACT

A method for manufacturing a semiconductor device includes: forming a channel portion which includes a semiconductor material; sequentially forming a first oxide film and a second oxide film on the channel portion, the first oxide film and the second oxide film being made of different materials, one of the first oxide film and the second oxide film including a rare-earth metal; performing a treatment such that the first oxide film and the second oxide film are formed into an interfacial layer which includes a first dielectric material and which is formed on the channel portion; forming a gate dielectric layer which includes a second dielectric material and which is formed on the interfacial layer, the second dielectric material being different from the first dielectric material; and forming a gate electrode on the gate dielectric layer.

20 Claims, 26 Drawing Sheets

SEMICONDUCTOR DEVICE INCLUDING INTERFACIAL LAYER WITH CET SCALING AND METHOD FOR MANUFACTURING THE SAME

BACKGROUND

Transistors are key active components in modern integrated circuits (IC). With rapid development of semiconductor technology, critical dimension (CD) of transistors keeps shrinking and various three-dimensional (3D) transistor structures are developed, making it possible to integrate a large number of transistors per unit area. In each of the transistors, an insulating portion is disposed to separate a gate electrode from a channel. With the scaling down of the size of the transistors, how to reduce the capacitance equivalent thickness (CET) of the insulating portion, but at the same time, keep the insulating portion at a sufficient physical thickness are key challenges to overcome in order to obtain transistors with better operating performance and lower gate leakage current.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
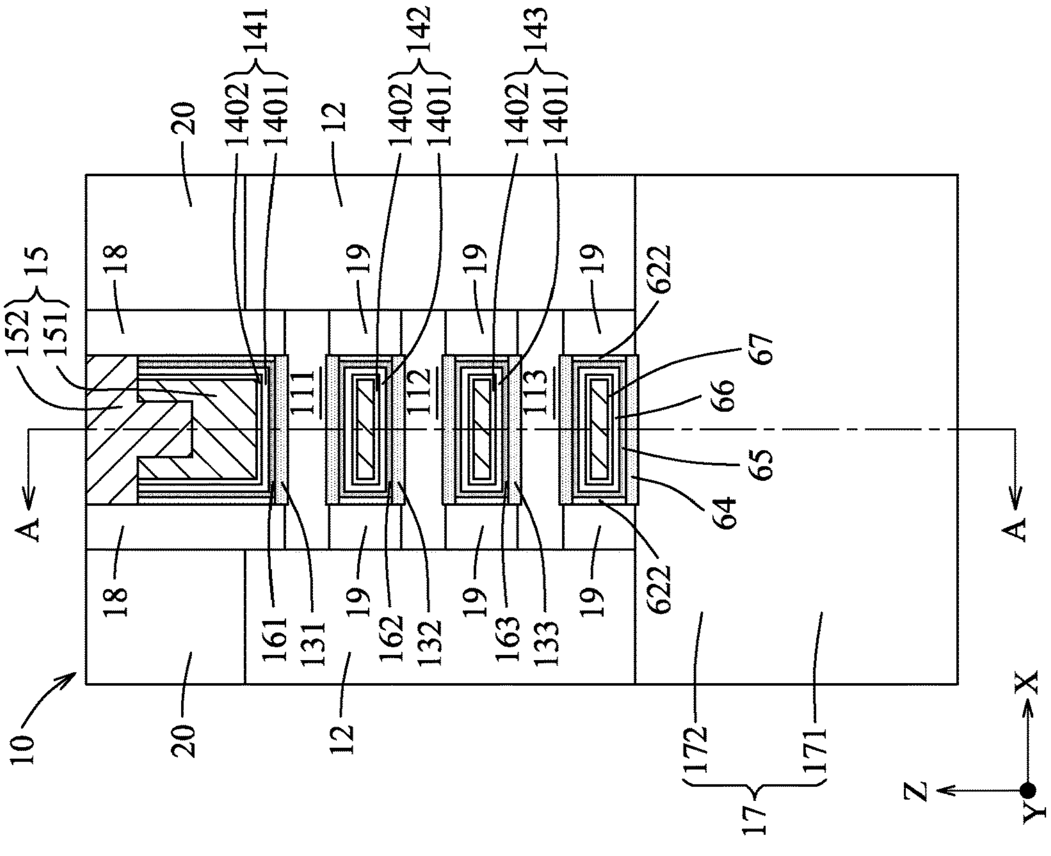
FIG. 1A is a schematic sectional view illustrating a semiconductor device in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “on,” “above,” “top,” “bottom,” “upper,” “lower,” “over,” “beneath,” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

For the purposes of this specification and appended claims, unless otherwise indicated, all numbers expressing amounts, sizes, dimensions, proportions, shapes, formulations, parameters, percentages, quantities, characteristics, or other numerical values used in the specification and claims, are to be understood as being modified in all instances by the terms “about” and “substantially” even if the terms “about” and “substantially” are not explicitly recited with the values, amounts or ranges. Accordingly, unless indicated to the contrary, the numerical parameters set forth in the following specification and appended claims are not and need not be exact, but may be approximations and/or larger or smaller than specified as desired, may encompass tolerances, conversion factors, rounding off, measurement error, and other factors known to those of skill in the art depending on the desired properties sought to be obtained by the presently disclosed subject matter. For example, the terms “about” and “substantially,” when used with a value, can capture variations of, in some aspects±10%, in some aspects±5%, in some aspects±2.5%, in some aspects±1%, in some aspects±0.5%, and in some aspects±0.1% from the specified amount, as such variations are appropriate to perform the disclosed methods or employ the disclosed compositions.

The term “source/drain portion(s)” may refer to a source or a drain, individually or collectively dependent upon the context.

For advanced semiconductor technology nodes, a high-k/metal gate stack for controlling a channel of a transistor includes an insulating portion and an electrode portion. The electrode portion is separated from the channel by the insulating portion and is electrically conductive. The insulating portion includes a gate dielectric layer formed over the channel, and an interfacial layer which is formed between the channel and the gate dielectric layer and which serves to provide good adhesion between the channel and the gate dielectric layer. As known to a person skilled in the art, equivalent oxide thickness (EOT) is defined as the thickness required for a silicon dioxide layer of a transistor to achieve a similar capacitance density as a high dielectric constant (high-k) material used. The value of EOT is positively correlated with the value of a capacitance equivalent thickness (CET). Specifically, the greater the dielectric constant of an insulating film, the lower the CET value of the insulating film, and vice versa. Typically, the channel may be made of silicon, and the interfacial layer may be made of silicon oxide which is formed by an oxidation reaction that happens on a surface portion of the silicon channel. The dielectric constant of silicon oxide is significantly smaller than the dielectric constant of a high-k material (e.g., hafnium oxide) used in the gate dielectric layer, and thus a CET value of the silicon oxide interfacial layer is significantly greater than a CET value of the high-k gate dielectric layer. Sometimes, a ratio of the CET value of the silicon oxide interfacial layer to the total CET value of the insulating portion (i.e., a sum of the CET value of the silicon oxide interfacial layer and the CET value of the high-k gate dielectric layer) may be greater than about 70%. Therefore, the present disclosure is directed to a semiconductor device including an interfacial layer which has a reduced CET value so as to improve the performance (e.g., saturation drain current (Ids) in the channel) of the transistor, and provide a method for manufacturing the semiconductor device that includes the interfacial layer. The semiconductor device may be configured as a planar field effect transistor (FET), a fin-type field effect transistor (FinFET), a gate-all-around field effect transistor (GAAFET), complementary field-effect transistors (CFET) structure which includes two GAAFETs stacked on one another in a Z direction, a fork-sheet structure which includes two GAAFETs spaced part from each other in a Y direction transverse to the Z direction through a wall portion, or other suitable configurations utilizing the interfacial layer.

Figure 1B:
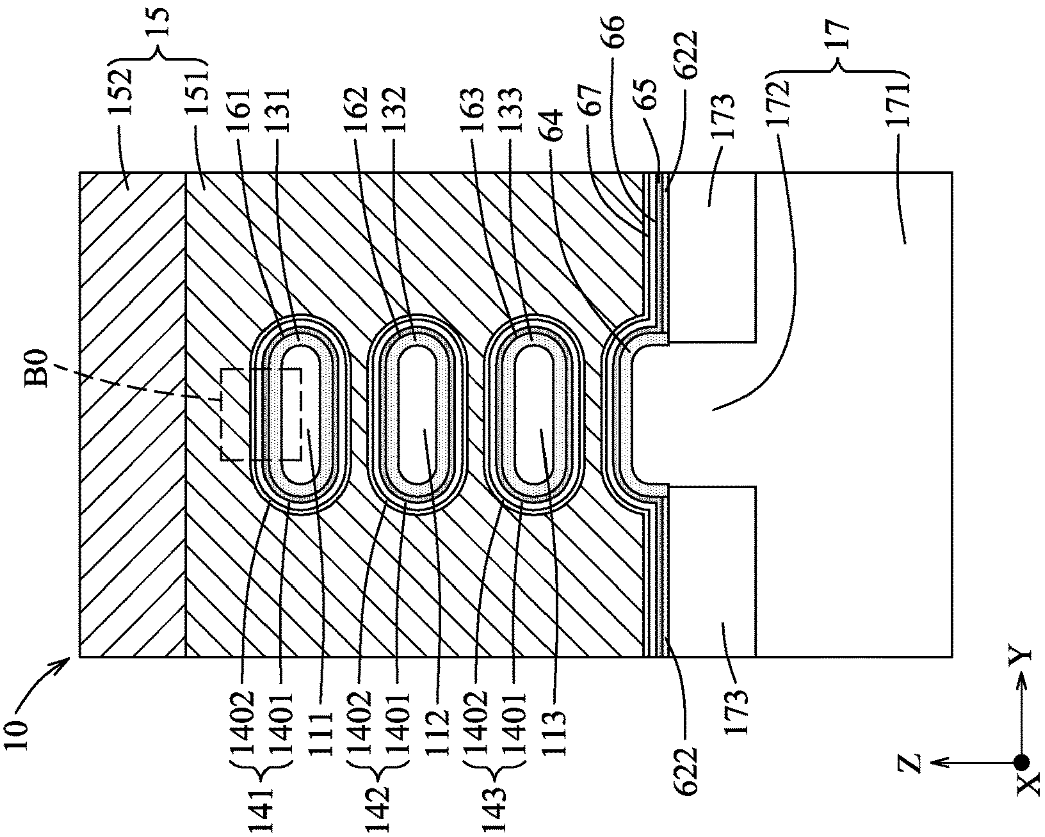
FIG. 1B is a schematic sectional view taken along line A-A of FIG. 1A in accordance with some embodiments.

FIG. 1A is a schematic sectional view illustrating a semiconductor device 10 in accordance with some embodiments. FIG. 1B is a schematic sectional view taken along line A-A of FIG. 1A in accordance with some embodiments.

In some embodiments, the semiconductor device 10 is formed on a substrate 17. The semiconductor device 10 includes at least one channel portion (three channel portions 111, 112, 113 are exemplarily shown in FIGS. 1A and 1B), two source/drain portions 12, at least one interfacial layer (three interfacial layers 131, 132, 133 are exemplarily shown in FIGS. 1A and 1B), at least one gate dielectric layer (three gate dielectric layers 141, 142, 143 are exemplarily shown in FIGS. 1A and 1B), and a gate electrode 15.

In some embodiments, the substrate 17 may include elemental semiconductor materials (such as crystalline silicon, diamond, or germanium), compound semiconductor materials (such as silicon carbide, gallium arsenide, indium arsenide, or indium phosphide), alloy semiconductor materials (such as silicon germanium, silicon germanium carbide, gallium arsenide phosphide, or gallium indium phosphide), or combinations thereof. In addition, the substrate 17 may be a bulk silicon substrate, a silicon-on-insulator (SOI) substrate, or a germanium-on-insulator (GOI) substrate. Other materials or configurations suitable for the substrate 17 are within the contemplated scope of the present disclosure. In some embodiments, the substrate 17 includes an underlying portion 171 and a fin portion 172 disposed on the underlying portion 171. In some embodiments, as shown in FIG. 1B, two isolation portions 173 are formed on the underlying portion 171 and respectively formed at two opposite sides of the fin portion 172 so as to permit the fin portion 172 to be separated from an adjacent fin portion (not shown). In some embodiments, the isolation portions 173 may each be a shallow trench isolation (STI), a deep trench isolation (DTI), or other suitable structures. In some embodiments, the isolation portions 173 may include silicon oxide, silicon nitride, silicon oxynitride, or combinations thereof. Other insulating materials suitable for the isolation portions 173 are within the contemplated scope of the present disclosure.

Referring to FIGS. 1A and 1B, the channel portions 111, 112, 113 are spaced apart from each other in the Z direction, and the channel portion 113 is spaced apart from the fin portion 172 of the substrate 17 in the Z direction. Each of the channel portions 111, 112, 113 includes a semiconductor material. In some embodiments, possible semiconductor materials suitable for the channel portions 111, 112, 113 are similar to those for the substrate 17, and thus the details thereof are omitted for the sake of brevity. In some embodiments, the semiconductor material of each of the channel portions 111, 112, 113 is silicon. Other semiconductor materials suitable for the channel portions 111, 112, 113 are within the contemplated scope of the present disclosure. In some embodiments, each of the channel portions 111, 112, 113 has a thickness in the Z direction ranging from about 3 nm to about 8 nm. In some embodiments, each of the channel portions 111, 112, 113 has a width in the Y direction ranging from about 15 nm to about 50 nm. In some embodiments, two adjacent ones of the channel portions 111, 112, 113 are spaced apart from each other in the Z direction by a distance ranging from about 5 nm to about 12 nm.

Referring to FIG. 1A, the two source/drain portions 12 are disposed on the fin portion 172 of the substrate 17, and spaced apart from each other in an X direction transverse to the Y and Z directions such that each of the channel portions 111, 112, 113 extends between the two source/drain portions 12. In some embodiments, the X, Y and Z directions are perpendicular to each other. In some embodiments, each of the source/drain portions 12 may include single crystalline silicon, polycrystalline silicon or other suitable materials. In some embodiments, the source/drain portions 12 may be doped with n-type impurities so as to function as a source/drain of an n-FET. The n-type impurities may be, for example, but not limited to, nitrogen (N), phosphorous (P), arsenic (As), antimony (Sb), other suitable materials, or combinations thereof. In some other embodiments, the source/drain portions 12 may be doped with p-type impurities so as to function as a source/drain of a p-FET. The p-type impurities may be, for example, but not limited to, boron (B), aluminum (Al), gallium (Ga), indium (In), other suitable materials, or combinations thereof. In some embodiments, each of the source/drain portions 12 may be formed as a multi-layered structure having several sub-layers (not shown) with different doping concentration and/or different dopants. In some embodiments, each of the source/drain portions 12 may be formed as a single layer structure.

Referring to FIGS. 1A and 1B, the interfacial layers 131, 132, 133 are respectively formed on the channel portions 111, 112, 113. Each of the interfacial layers 131, 132, 133 include a first dielectric material. Silicon oxide (without rare-earth metal) is widely used as a conventional interfacial layer and has a dielectric constant of about four. It is worth noting that the first dielectric material of each of the interfacial layers 131, 132, 133 has a dielectric constant that is greater than the dielectric constant of silicon oxide. The first dielectric material includes a rare-earth metal. For example, the first dielectric material may include scandium (Sc), yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), or combinations thereof. In some embodiments, the first dielectric material includes silicate of scandium (Sc), yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), or combinations thereof. In some embodiments, the first dielectric material includes yttrium silicate, gadolinium silicate, cerium silicate, lanthanum silicate, lutetium silicate, or combinations thereof. In some embodiments, each of the interfacial layers 131, 132, 133 has a thickness ranging from about 7 Å to about 17 Å.

The interfacial layers 131, 132, 133 of this disclosure have advantages as described below. When samples of the conventional silicon oxide interfacial layer and each of the interfacial layers 131, 132, 133 of this disclosure at the same physical thickness are compared, a CET value of each of the interfacial layers 131, 132, 133 may be smaller than a CET value of the conventional silicon oxide interfacial layer, and thus the saturation drain current (Ids) of the semiconductor device 10 may be boosted. When samples of the conventional silicon oxide interfacial layer and each of the interfacial layers 131, 132, 133 of this disclosure at the same CET value are compared, a physical thickness of each of the interfacial layers 131, 132, 133 may be greater than a physical thickness of the conventional silicon oxide interfacial layer, and thus the gate leakage current of the semiconductor device 10 may be suppressed.

Referring to FIGS. 1A and 1B, the gate dielectric layers 141, 142, 143 are respectively formed on the interfacial layers 131, 132, 133. Each of the gate dielectric layers 141, 142, 143 include a second dielectric material that is different from the first dielectric material of each of the interfacial layers 131, 132, 133. In some embodiments, the second dielectric material includes silicon oxide, silicon nitride, silicon oxynitride, a suitable high-k material (such as hafnium oxide, zirconium oxide, zirconium aluminum oxide, hafnium aluminum oxide, hafnium silicon oxide, aluminum oxide, etc.), other suitable materials, or combinations thereof. Other dielectric materials suitable for the gate dielectric layers 141, 142, 143 are within the contemplated scope of the present disclosure. In some embodiments, each of the gate dielectric layers 141, 142, 143 has a thickness ranging from about 10 Å to about 25 Å.

Referring to FIGS. 1A and 1B, the gate electrode 15 is formed around the gate dielectric layers 141, 142, 143 such that the gate electrode 15 is separated from each of the channel portions 111, 112, 113 by a corresponding one of the interfacial layers 131, 132, 133 and a corresponding one of the gate dielectric layers 141, 142, 143. In some embodiments, the gate electrode 15 may be configured as a multi-layered structure which includes a work-function portion 151 which is provided for adjusting threshold voltage of an n-FET or a p-FET, and an electrically conductive filling portion 152 which has a low resistance and which is provided for reducing overall electrical resistance of the gate electrode 15.

In some embodiments, the work-function portion 151 for forming an n-FET may be made of an n-band edge work-function material. In some embodiments, in the case that each of the channel portions 111, 112, 113 is made of silicon, the n-band edge work-function material may have a work function that is smaller than about 4.5 eV (i.e., a halfway energy level between energy levels of the conduction band edge and the valence band edge of silicon). In some embodiments, the n-band edge work-function material may have a work function ranging from about 4 eV to about 4.2 eV. In some embodiments, the n-band edge work-function material includes titanium aluminum, titanium aluminum carbide, titanium carbide, titanium silicon nitride, aluminum, tantalum aluminum carbide, tantalum aluminum silicide, tantalum silicon carbide, tantalum silicide, hafnium carbide, tantalum, titanium nitride, aluminum carbide, zirconium, silver, or combinations thereof. In some other embodiments, the n-band edge work-function material may also be used for forming the work-function portion 151 of a p-FET, and such a case will be exemplified later.

In some embodiments, the work-function portion 151 for forming a p-FET may be made of a p-band edge work-function material. In some embodiments, in the case that each of the channel portions 111, 112, 113 is made of silicon, the p-band edge work-function material may have a work function that is greater than about 4.5 eV. In some embodiments, the p-band edge work-function material may have a work function ranging from about 4.9 eV to about 5.2 eV. In some embodiments, the p-band edge work-function material includes titanium nitride, tungsten, tungsten carbon nitride, ruthenium, molybdenum, tantalum nitride, tungsten nitride, tantalum silicon nitride, chromium, osmium, rhenium, rhodium, iridium, platinum, or combinations thereof. In some other embodiments, the p-band edge work-function material may be also used for forming the work-function portion 151 of an n-FET, and such a case will be exemplified later.

In some embodiments, the work-function portion 151 may be made of a mid-gap work function material which has a Fermi-energy level that is close to halfway between energy levels of a conduction band edge and a valence band edge of each of the channel portions 111, 112, 113. When each of the channel portions 111, 112, 113 is made of silicon, the work-function portion 151 may include titanium nitride, tantalum nitride, titanium aluminide, titanium aluminum carbide, titanium aluminum carbon nitride, or combinations thereof. The mid-gap work function material is suitable for forming the work-function portion 151 of both the n-FET and the p-FET. Other materials suitable for the work-function portion 151 are within the contemplated scope of the present disclosure.

In some embodiments, the electrically conductive filling portion 152 includes tungsten (W), cobalt (Co), ruthenium (Ru), iridium (Ir), alloy thereof, or combinations thereof. Other materials suitable for the electrically conductive filling portion 152 are within the contemplated scope of the present disclosure.

Figure 2:
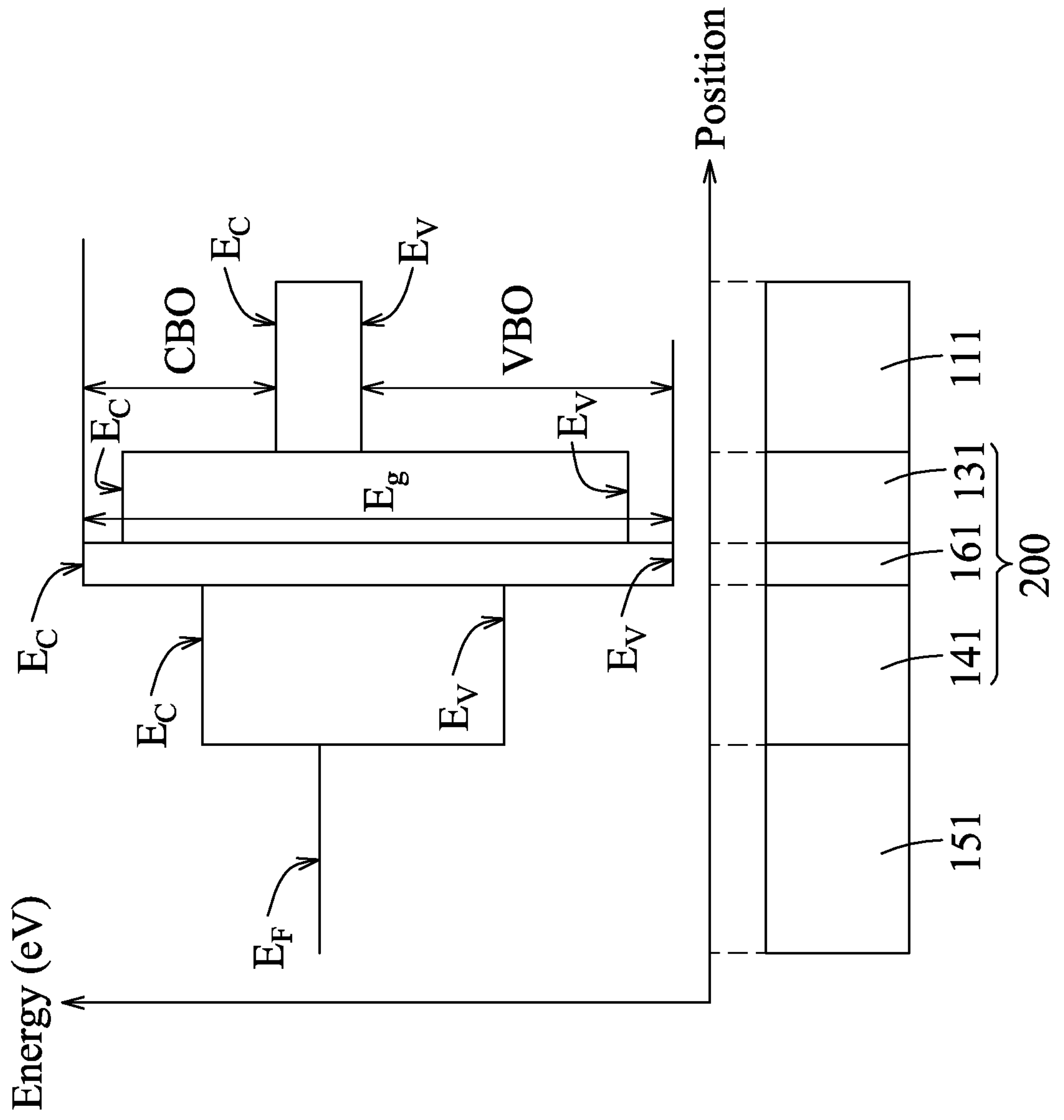
FIG. 2 illustrates an energy band diagram of the elements shown in area B0 of FIG. 1B in accordance with some embodiments.

FIG. 2 illustrates an energy band diagram of the elements 111, 131, 161, 141, 151 shown in area B0 of FIG. 1B in accordance with some embodiments. In FIG. 2, the vertical axis represents the energy level of (i) Fermi level ($E_F$) of the work-function portion 151, and (ii) a conduction band edge energy ($E_c$) and a valence band edge energy ($E_v$) of each of the channel portion 111, the interfacial layer 131, the element 161 (to be described below), and the gate dielectric layer 141; and the horizontal axis represents the position of each of the channel portion 111, the interfacial layer 131, the element 161 (to be described below), the gate dielectric layer 141, and the work-function portion 151.

In some embodiments, the conduction band edge energy ($E_c$) of the first dielectric material of the interfacial layers 131, 132, 133 may be slightly lower than a conduction band edge energy of the conventional silicon oxide interfacial layer (not shown). In some embodiments, the valence band edge energy ($E_v$) of the first dielectric material of the interfacial layers 131, 132, 133 may be slightly higher than a valence band edge energy of the conventional silicon oxide interfacial layer (not shown). In these two cases, the semiconductor device 10 may further include barrier layers 161, 162, 163, each of which is disposed between one of the interfacial layers 131, 132, 132 and a corresponding one of the gate dielectric layers 141, 142, 143. Each of the barrier layers 161, 162, 163 has a thickness ranging from about 4 Å to about 7 Å. Each of the barrier layers 161, 162, 163 includes a barrier material.

As shown in FIG. 2, the barrier material of the barrier layer 161 has a relatively greater band gap energy ($E_g$, an energy gap between the conduction band edge energy ($E_c$) and the valence band edge energy ($E_v$) thereof). To be specific, the conduction band edge energy ($E_c$) of the barrier material of the barrier layer 161 is greater than the conduction band edge energy ($E_c$) of each of the first dielectric material of the interfacial layer 131 and the second dielectric material of the gate dielectric layer 141. In addition, the valence band edge energy ($E_v$) of the barrier material of the barrier layer 161 is lower than the valence band edge energy ($E_v$) of each of the first dielectric material of the interfacial layer 131 and the second dielectric material of the gate dielectric layer 141. In some embodiments, the barrier material includes aluminum oxide, but is not limited thereto. Other high band gap energy materials suitable for the barrier material are within the contemplated scope of the present disclosure.

The interfacial layer 131, the barrier layer 161 and the gate dielectric layer 141 which are disposed between the channel portion 111 and the work-function portion 151 may be collectively referred to as an insulating portion 200. Major carriers travelling in the channel portion 111 may be electrons that move on conduction bands, or holes that move on valence bands. The leakage current between the channel portion 111 and the work-function portion 151 can be controlled by the physical thickness of the insulating portion 200 and/or the band diagram of the insulating portion 200. In detail, a minimum energy barrier for the electrons to overcome so as to have access to the work-function portion 151 is referred to as a conduction band edge offset (CBO). The conduction band edge offset (CBO) is defined by an energy difference between the conduction band edge energy ($E_c$) of the channel portion 111 and a maximum conduction band edge energy ($E_c$) in the insulating portion 200. (i.e., the conduction band edge energy ($E_c$) of the barrier layer 161). A minimum energy barrier for the holes to overcome so as to have an access to the work-function portion 151 is referred to as a valence band edge offset (VBO). The valence band edge offset (VBO) is defined by an energy difference between the valence band edge energy ($E_v$) of the channel portion 111 and a minimum valence band edge energy ($E_v$) in the insulating portion 200 (i.e., the valence band edge energy ($E_v$) of the barrier layer 161). As shown in FIG. 2, due to high band gap energy ($E_g$) of the barrier layer 161, the CBO value is dominated by the conduction band edge energy ($E_c$) of the barrier layer 161, and the VBO value is dominated by the valence band edge energy ($E_v$) of the barrier layer 161. Therefore, the barrier material which has a relatively high band gap energy can compensate for a reduced CBO or a reduced VBO caused by a relatively small band energy gap of the first dielectric material. As such, with the introduction of the interfacial layer 131 having a relatively high dielectric constant, the insulating portion 200 may have a scaled down CET value. Besides, with the introduction of the barrier layer 161 having a relative high band gap energy ($E_g$), each of the CBO value and the VBO value can remain at a sufficient large value to meet the specification of the leakage current of the semiconductor device 10.

In some embodiments, the semiconductor device 10 further includes n-dipole elements and/or n-dipole elements which are provided for adjusting threshold voltage of an n-FET or a p-FET, and which are present in the interfacial layers 131, 132, 133 and/or the gate dielectric layers 141, 142, 143. The details of the n-dipole elements and/or n-dipole elements will be described hereinafter.

In some embodiments, referring back to FIGS. 1A and 1B, the semiconductor device 10 may further include two gate spacers 18, multiple pairs of inner spacers 19, and two inter-layer dielectric (ILD) portions 20, and the details thereof will be described hereinafter.

The threshold voltage for an n-FET is a positive value, while the threshold voltage for a p-FET is a negative value. It is noted that the threshold voltage of the semiconductor device 10 may become more negative due to presence of the rare earth metal in the interfacial layers 131, 132, 133. In the following method for manufacturing a plurality of the semiconductor devices 10, a dipole process will be utilized to introduce the n-dipole elements and/or the p-dipole elements into the interfacial layers 131, 132, 133 and/or the gate dielectric layers 141, 142, 143 of each of the semiconductor devices 10 such that the semiconductor devices 10 may have different values of threshold voltage (Vt) to meet customer requirements.

Figure 3:
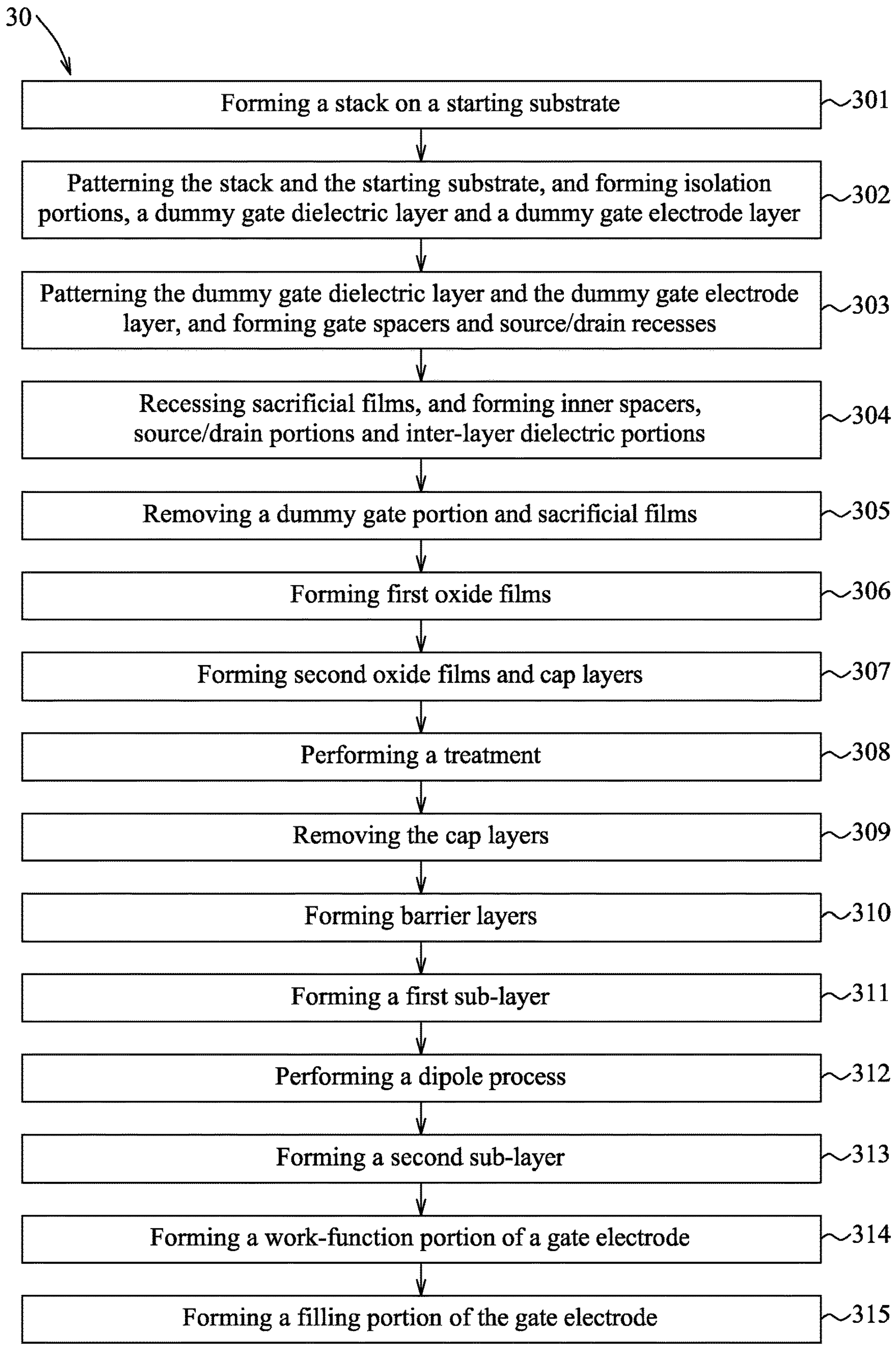
FIG. 3 is a flow diagram illustrating a method for manufacturing a semiconductor structure including a plurality of semiconductor devices in accordance with some embodiments.

FIG. 3 is a flow diagram illustrating a method 30 for manufacturing a semiconductor structure 100 including six of the semiconductor devices 10 (see FIG. 37, in which each of the semiconductor devices 10 is partially shown) in accordance with some embodiments. In some embodiments, a portion of each of the semiconductor devices 10 shown in FIG. 37 may be exemplified as a portion of the semiconductor devices 10 shown in FIGS. 1A and 1B. FIGS. 4 to 42 illustrate schematic views of intermediate stages of the method 30 in accordance with some embodiments. Similar numerals from the above-mentioned embodiments have been used where appropriate, with some construction differences being indicated with different numerals. It should be noted that (i) the number of the semiconductor devices 10 may vary according to practical requirements, and that (ii) although each of the semiconductor devices 10 manufactured by the method 30 is configured as a GAAFET, the method 30 may be used for manufacturing other suitable transistors that utilize the interfacial layer of this disclosure.

Figure 4:
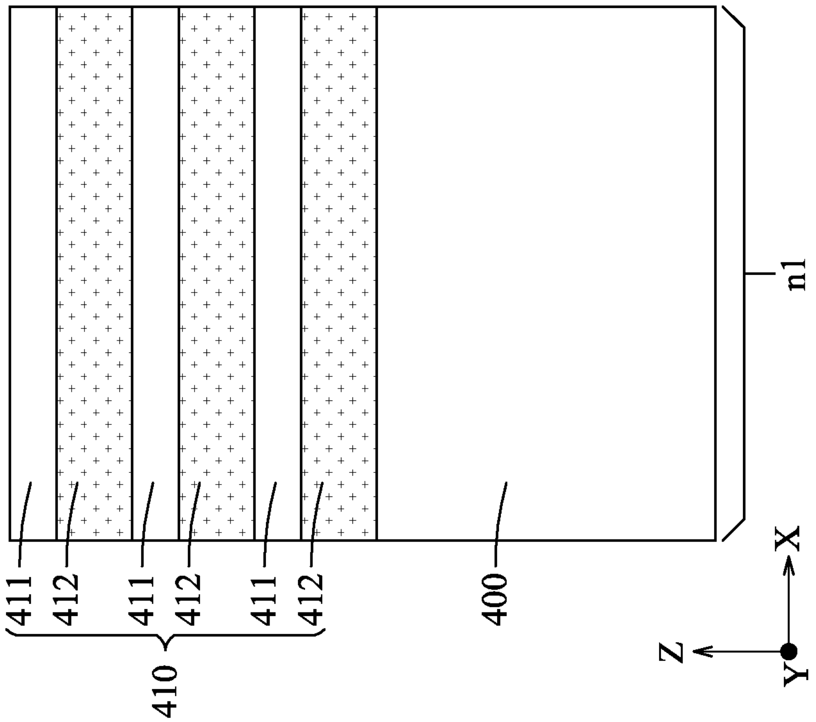
FIGS. 4 to 42 illustrate schematic views of intermediate stages of the method depicted in FIG. 3 in accordance with some embodiments.

Referring to FIG. 3 and the example illustrated in FIG. 4, the method 30 begins at step 301, where a stack 410 is formed on a starting substrate 400 by chemical vapor deposition (CVD), atomic layer deposition (ALD), an epitaxial growth process (such as molecular-beam epitaxy (MBE), selective area epitaxy (SAE), etc.), or other suitable deposition techniques.

The starting substrate 400 will be patterned into the substrate 17 (see FIGS. 1A and 1B) in a subsequent step, and thus, the starting substrate 400 includes the material(s) of the substrate 17. In some embodiments, the starting substrate 400 includes first, second and third n-regions n1, n2, n3, and first, second and third p-regions p1, p2, p3 (only the n-region n1 is shown in FIG. 4), and the regions n1, n2, n3, p1, p2, p3 are displaced from each other (the position relationship of the regions n1, n2, n3, p1, p2, p3 may be exemplified in FIG. 18). The n-region n1 of the starting substrate 400 and the stack 410 formed thereon are shown in FIG. 4. Since each of the other regions n2, n3, p1, p2, p3 and the stack 410 formed thereon have a structure similar to the structure shown in FIG. 4, and thus are omitted for the sake of brevity. The n-regions n1, n2, n3 and the p-regions p1, p2, p3 are designed for respectively forming the six semiconductor devices 10 thereon. Three of the semiconductor devices 10 respectively formed at the n-regions n1, n2, n3 are n-type GAAFETs having different values of threshold voltage (Vt), and the other three of the semiconductor devices 10 respectively formed at the p-regions p1, p2, p3 are p-type GAAFETs having different values of threshold voltage (Vt).

The stack 410 is disposed to cover each of the regions n1, n2, n3, p1, p2, p3, and includes three channel layers 411 and three sacrificial layers 412 disposed to alternate with the channel layers 411 in the Z direction. The channel layers 411 are used for forming the channel portions 111, 112, 113 (see FIGS. 1A, 1B), and thus each of the channel layers 411 includes the semiconductor material for forming the channel portions 111, 112, 113. Each of the sacrificial layers 412 is made of a material different from the semiconductor material of the channel layers 411, such that each of the sacrificial layers 412 may be selectively removed with the channel layers 411 being substantially intact due to different etching selectivities. In some embodiments, each of the channel layers 411 is made of silicon, and each of the sacrificial layers 412 is made of silicon germanium. In some embodiments, each of the channel layers 411 has a thickness ranging from about 3 nm to about 8 nm. In some embodiments, each of the sacrificial layers 112 has a thickness ranging from about 5 nm to about 12 nm.

Figure 5B:
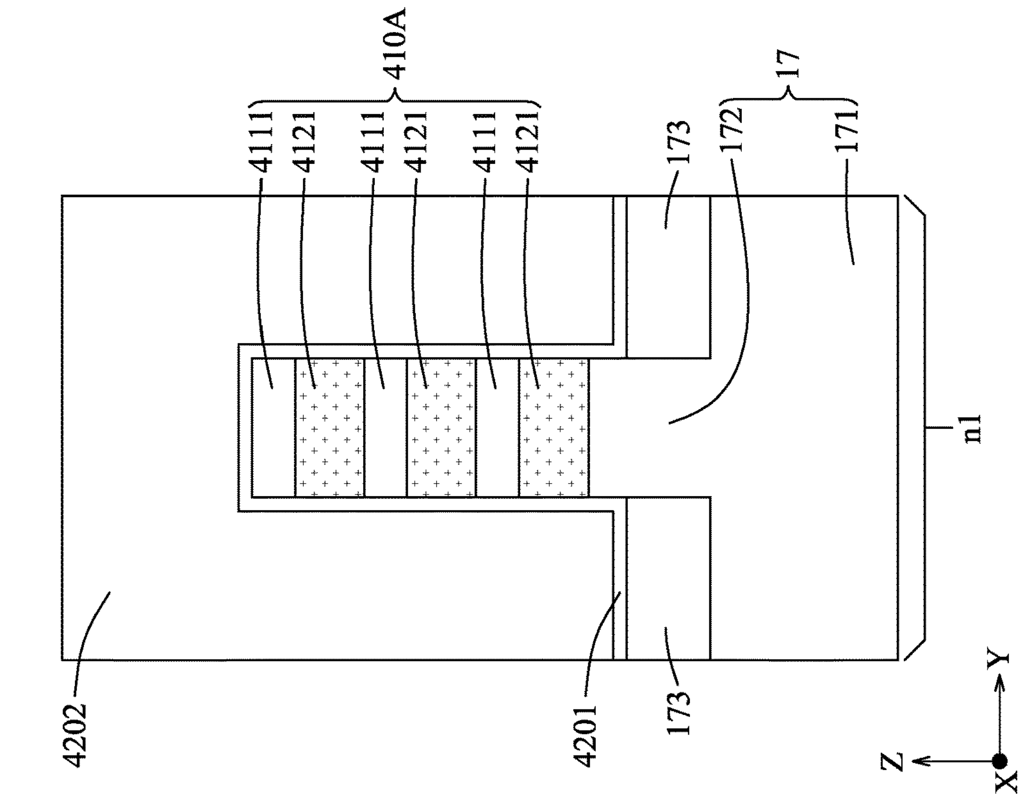
Figure 5A:
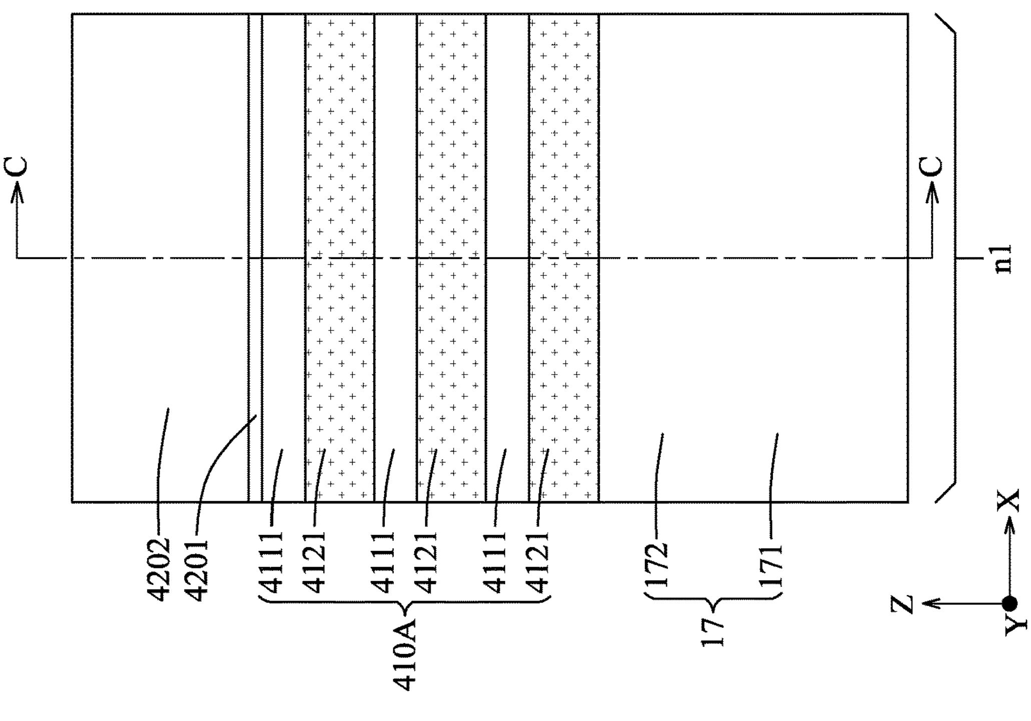

Referring to FIG. 3 and the examples illustrated in FIGS. 5A and 5B, the method 30 proceeds to step 302, where the stack 410 and the starting substrate 400 (see FIG. 4) are processed to form the two isolation portions 173, a dummy gate dielectric layer 4201 and a dummy gate electrode layer 4202 at each of the regions n1, n2, n3, p1, p2, p3. FIG. 5A is a schematic sectional view similar to FIG. 4, but illustrating the structure after step 302. FIG. 5B is a schematic sectional view taken along line C-C of FIG. 5A in accordance with some embodiments.

The starting substrate 400 is patterned into the underlying portion 171 (see also FIGS. 1A and 1B) and the fin portion 172 disposed on each of regions n1, n2, n3, p1, p2, p3 of the underlying portion 171 by suitable processes including lithography and etching steps, although only the underlying portion 171 and the fin portion 172 at the n-region n1 are shown in FIGS. 5A and 5B. Since the regions n1, n2, n3, p1, p2, p3 of the underlying portion 171 respectively correspond to the regions n1, n2, n3, p1, p2, p3 of the starting substrate 400 (see FIG. 4), the same numerals are used. In addition, at each of the regions n1, n2, n3, p1, p2, p3, a stacking portion 410A, which is patterned from the stack 410, is formed on the fin portion 172, although only the stacking portion 410A at the n-region n1 is shown in FIGS. 5A and 5B. The stacking portion 410A includes three channel films 4111 that are obtained from the channel layers 411 (see FIG. 4) and three sacrificial films 4121 that are obtained from the sacrificial layers 412 (see FIG. 4).

At each of regions n1, n2, n3, p1, p2, p3, the two isolation portions 173 are formed on the underlying portion 171, and respectively at two opposite sides of the fin portion 172 in the Y direction using suitable processes including a deposition technique (for example, but not limited to, CVD or ALD) and an etching technique (for example, but not limited to, dry etching, wet etching, or a combination thereof). Since the configuration and material of the isolation portions 173 have been described above with reference to FIG. 1B, and thus the details thereof are not repeated for the sake of brevity.

The dummy gate dielectric layer 4201 and the dummy gate electrode layer 4202 are sequentially formed to cover the isolation portions 173 and the stacking portion 410A in such order at each of the regions n1, n2, n3, p1, p2, p3 by CVD, ALD, physical vapor deposition (PVD), or other suitable deposition techniques, followed by a planarization process (e.g., chemical mechanical polishing) to obtain a planar upper surface of the dummy gate electrode layer 4202. In some embodiments, the dummy gate dielectric layer 4201 may include silicon oxide, silicon nitride, silicon oxynitride, high dielectric constant (k) materials, other suitable dielectric materials, or combinations thereof. The dummy gate electrode layer 4202 may include polycrystalline silicon, single crystalline silicon, amorphous silicon, or combinations thereof. Other materials suitable for the dummy gate dielectric layer 4201 and the dummy gate electrode layer 4202 are within the contemplated scope of the present disclosure.

Figure 6B:
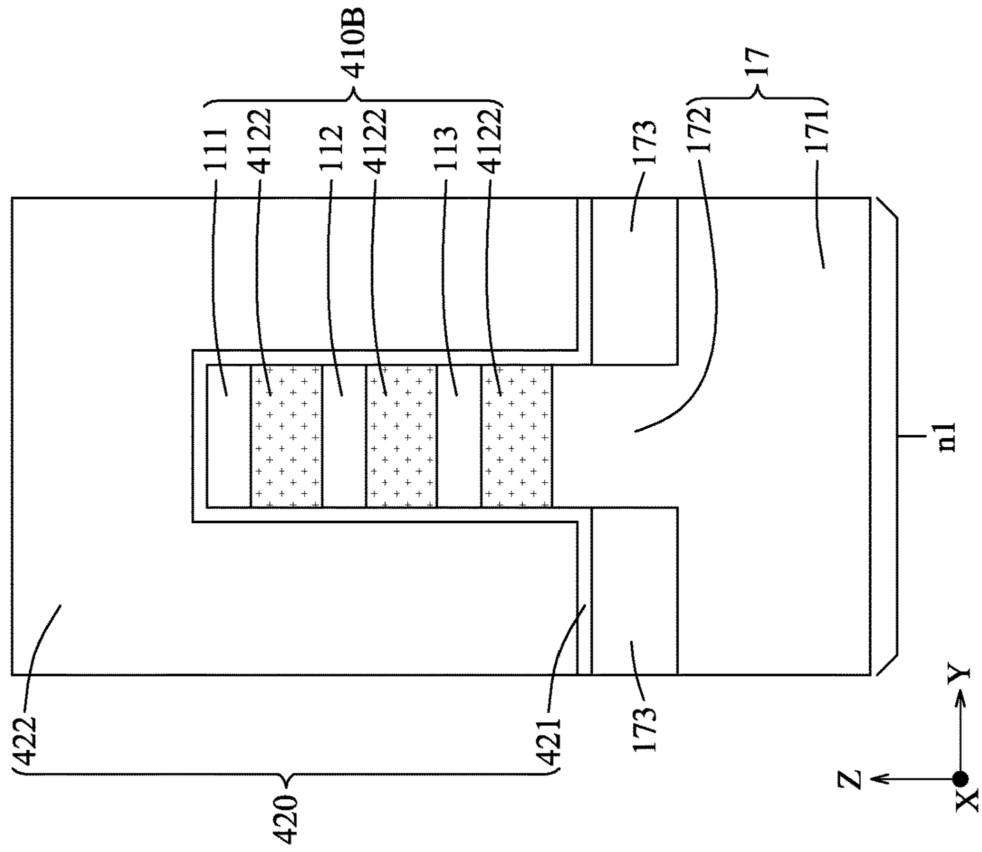
Figure 6A:
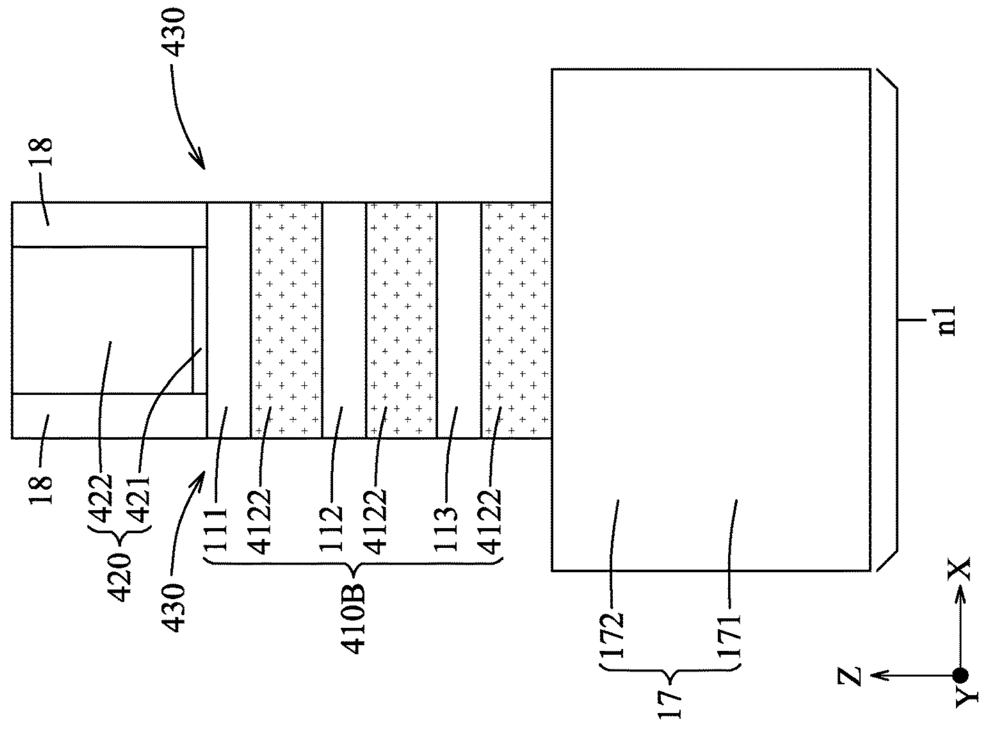

Referring to FIG. 3 and the examples illustrated in FIGS. 6A and 6B, the method 30 proceeds to step 303, where the dummy gate dielectric layer 4201 and the dummy gate electrode layer 4202 (see FIG. 5A) are patterned, and then at each of the regions n1, n2, n3, p1, p2, p3, the two gate spacers 18 and two source/drain recesses 430 are formed. FIGS. 6A and 6B are schematic sectional views respectively similar to FIGS. 5A and 5B, but illustrating the structures after step 303. In some embodiments, step 303 may be performed as follow.

First, at each of the regions n1, n2, n3, p1, p2, p3, a dummy gate portion 420 is formed over the stacking portion 410A (see FIG. 5A) by patterning the dummy gate dielectric layer 4201 and the dummy gate electrode portion 422 (see FIG. 5A) using a photolithography technique and/or an etching technique (for example, but not limited to, dry etching, wet etching, or a combination thereof). The dummy gate portion 420 is elongated in the Y direction, and includes a dummy gate dielectric portion 421 that is patterned from the dummy gate dielectric layer 4201 (see FIG. 5A) and a dummy gate electrode portion 422 that is patterned from the dummy gate electrode layer 4202 (see FIG. 5A).

Then, at each of the regions n1, n2, n3, p1, p2, p3, the two gate spacers 18 are respectively formed at two opposite sides of the dummy gate portion 420 in the X direction by CVD, ALD, PVD, or other suitable deposition techniques, followed by an isotropic etching process to expose the dummy gate portion 420 and the stacking portion 410A (see FIG. 5A). The gate spacers 18 may be made of a dielectric material which includes a nitride-based material, such as silicon nitride, silicon oxynitride, silicon carbon nitride, silicon oxycarbonitride, but is not limited thereto. Other dielectric materials suitable for the gate spacers 18 are within the contemplated scope of the present disclosure.

Afterwards, at each of the regions n1, n2, n3, p1, p2, p3, the stacking portion 410A (see FIG. 5A) is patterned to form the two source/drain recesses 430 by an etching technique (for example, but not limited to, dry etching, wet etching, or a combination thereof). The two source/drain recesses 430 are respectively located at two opposite sides of the dummy gate portion 420 in the X direction.

After step 303, the patterned stacking portion is denoted by the numeral 410B. In the patterned stacking portion 410B, the patterned channel films serve as the channel portions 111, 112, 113 of a corresponding one of the semiconductor devices 10, and the patterned sacrificial films are denoted by the numeral 4122.

Figure 7B:
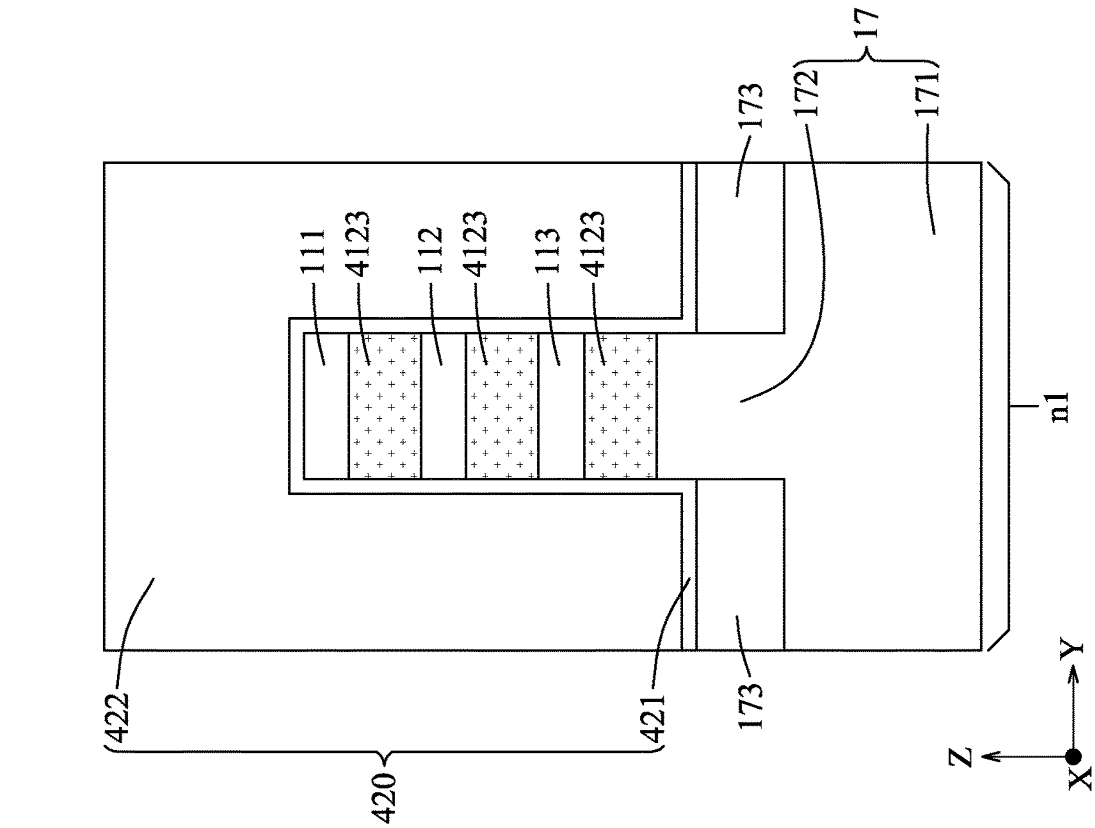
Figure 7A:
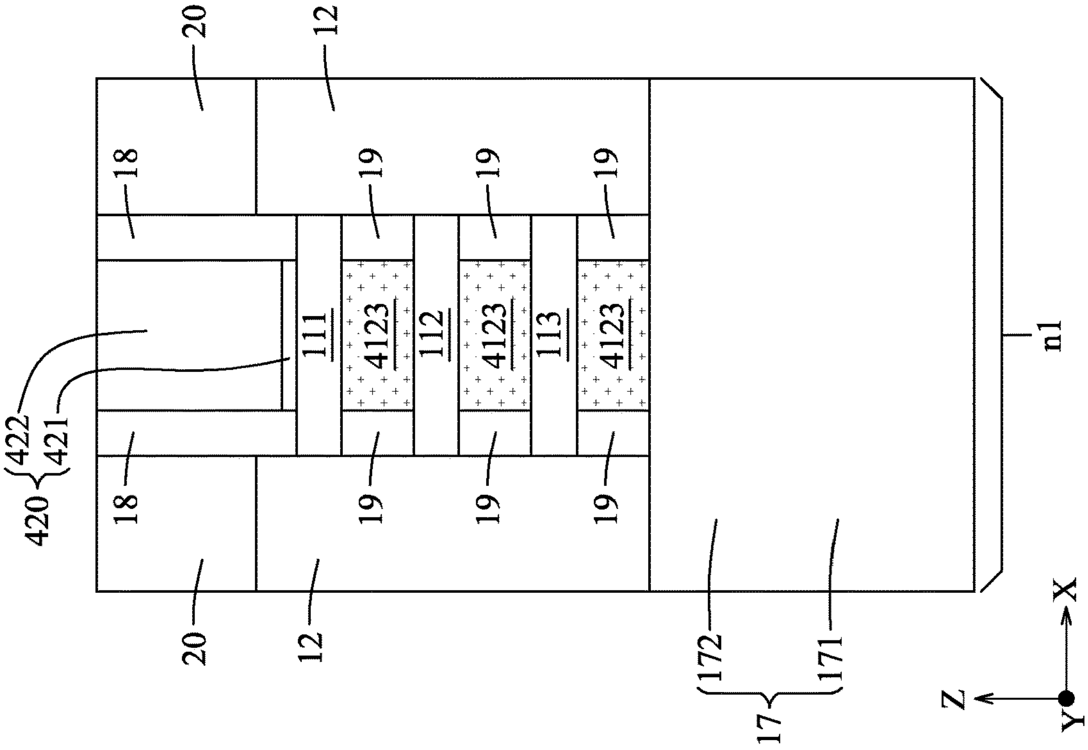

Referring to FIG. 3 and the examples illustrated in FIGS. 7A and 7B, the method 30 proceeds to step 304, where at each of the regions n1, n2, n3, p1, p2, p3, the sacrificial films 4122 (see FIG. 6A) are recessed, and then the multiple pairs of the inner spacers 19, the two source/drain portions 12, and the two ILD portions 20 are formed. FIGS. 7A and 7B are schematic sectional views respectively similar to FIGS. 6A and 6B, but illustrating the structures after step 304. In some embodiments, step 304 may be performed as follow.

First, at each of the regions n1, n2, n3, p1, p2, p3, the sacrificial films 4122 (see FIG. 6A) are laterally trimmed using an etching process. As shown in FIG. 7A, the trimmed sacrificial films are denoted by the numeral 4123.

Then, at each of the regions n1, n2, n3, p1, p2, p3, each pair of the inner spacers 19 are formed at two opposite sides of a corresponding one of the trimmed sacrificial films 4123 in the X direction by depositing a low-k dielectric material for forming the inner spacers 19 using CVD, ALD, PVD, or other suitable deposition techniques, followed by an isotropic etching process to remove excess portions of the low-k dielectric material. In some embodiments, the low-k dielectric material for forming the inner spacers 19 may include silicon oxide, silicon nitride, silicon oxynitride, silicon carbonitride, silicon oxycarbide, silicon oxycarbonitride, silicon carbide, and so on. Other low-k dielectric materials suitable for the inner spacers 19 are within the contemplated scope of the present disclosure.

Afterwards, at each of the regions n1, n2, n3, p1, p2, p3, the two source/drain portions 12 are respectively formed in the two source/drain recesses 430 (see FIG. 6A) using an epitaxial growth process including molecular-beam epitaxy (MBE), an epitaxial deposition/partial etch process, such as a cyclic deposition-etch (CDE) process and/or a selective epitaxial growth (SEG) process, but the disclosure is not limited to such. The details of the materials suitable for the source/drain portions 12 have been described above with reference to FIG. 1A, and are not repeated herein for the sake of brevity. It is noted that the source/drain portions 12 at each of the n-regions n1, n2, n3 include the n-type impurities, and that the source/drain portions 12 at each of the p-regions p1, p2, p3 include the p-type impurities.

After formation of the source/drain portions 12, at each of the regions n1, n2, n3, p1, p2, p3, the two ILD portions 20 are respectively disposed to cover the two source/drain portions 12 using a deposition process followed by a planarization process to expose the dummy gate portion 420. In some embodiments, the ILD portions 20 may include dielectric material(s) and may be formed as a single-layer structure, a bi-layered structure or a multi-layered structure. In some embodiments, the ILD portions 20 may include silicon nitride, silicon oxynitride, phosphosilicate glass (PSG), borosilicate glass (BSG), borophosphosilicate glass (BPSG), undoped silicate glass (USG), fluorinated silicate glass (FSG), silicon oxycarbide (SiOxCy), spin-on-glass (SOG), or combinations thereof. Other dielectric materials suitable for the ILD portions 20 are within the contemplated scope of the present disclosure.

Figure 8B:
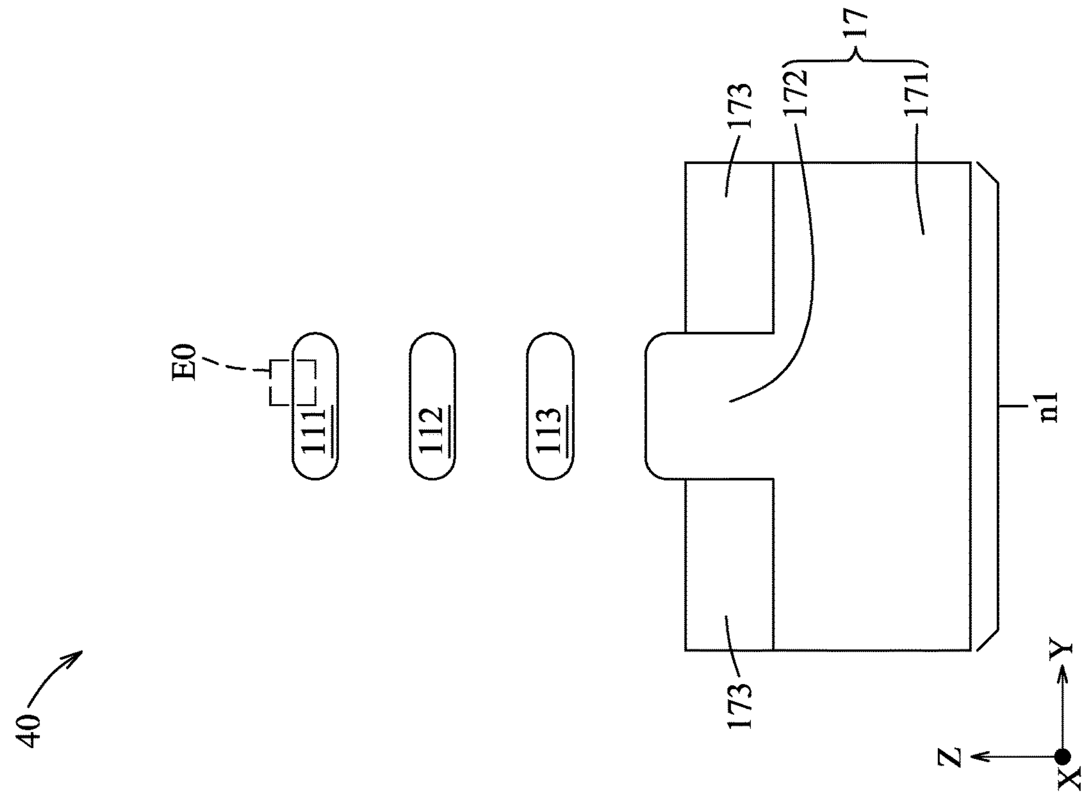
Figure 8A:
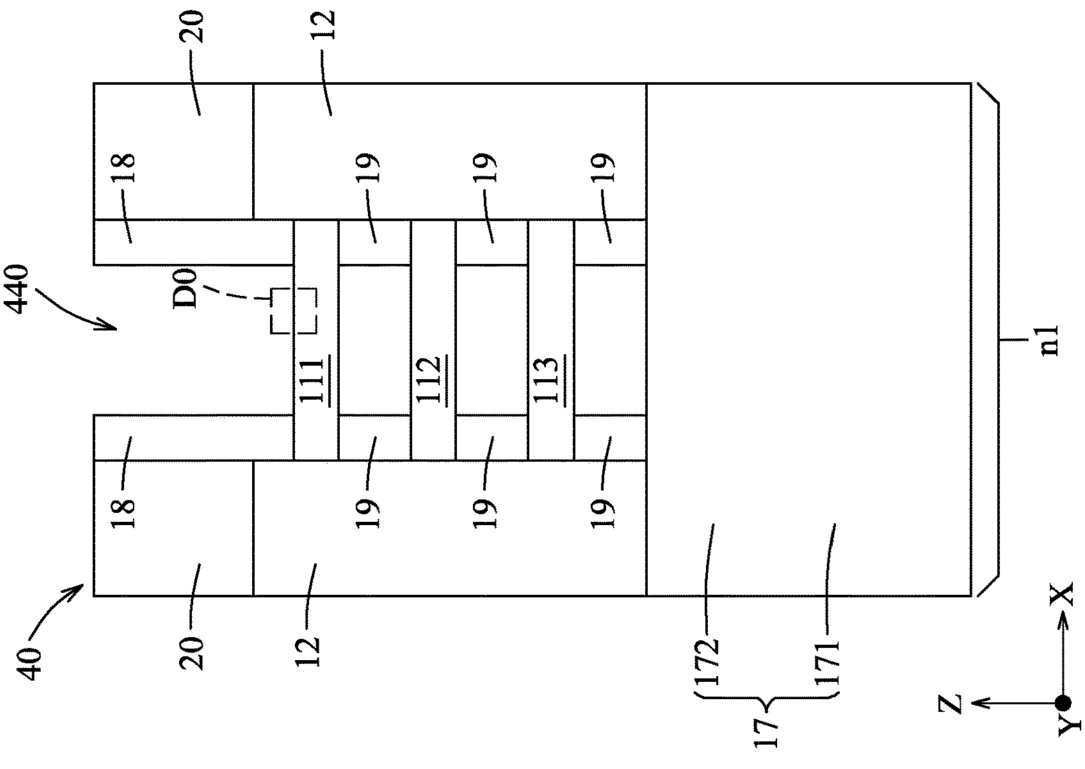

Referring to FIG. 3 and the examples illustrated in FIGS. 8A and 8B, the method 30 proceeds to step 305, where at each of the regions n1, n2, n3, p1, p2, p3, the dummy gate portion 420 and the sacrificial films 4123 (see FIGS. 7A and 7B) are removed to form a cavity 440 using a selective etching process (e.g., a wet etching process) without damaging the channel portions 111, 112, 113. FIGS. 8A and 8B are schematic sectional views respectively similar to FIGS. 7A and 7B, but illustrating the structures after step 305.

After step 305, six of patterned structures 40 (only one of which at the region n1 is shown in FIGS. 8A and 8B) respectively formed on the regions n1, n2, n3, p1, p2, p3 of the substrate 17 are thus obtained. Each of the patterned structures 40 includes the three channel portions 111, 112, 113, the two source/drain portions 12, the two gate spacers 18, the three pairs of the inner spacers 19, and the two ILD portions 20.

Figure 18:
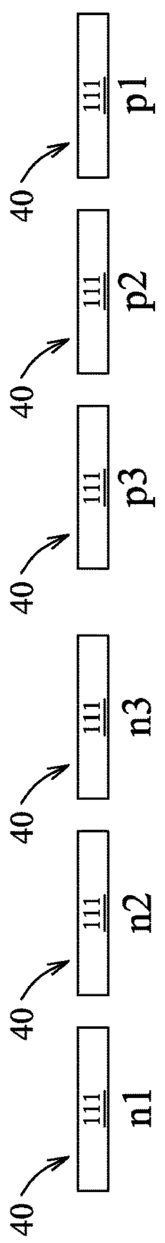

FIG. 18 is a schematic view illustrating regions DO (see FIG. 8A) of the patterned structures 40 or regions E0 (see FIG. 8B) of the patterned structures 40 in accordance with some embodiments. That is, an upper portion of the channel portion 111 at each of the regions n1, n2, n3, p1, p2, p3 is shown in FIG. 18, while other elements are omitted. It is noted that the figures subsequent to FIG. 19 merely further schematically illustrate the element(s) formed on the upper portion of the channel portion 111 at each of the regions n1, n2, n3, p1, p2, p3, and are not drawn to scale.

Figure 9B:
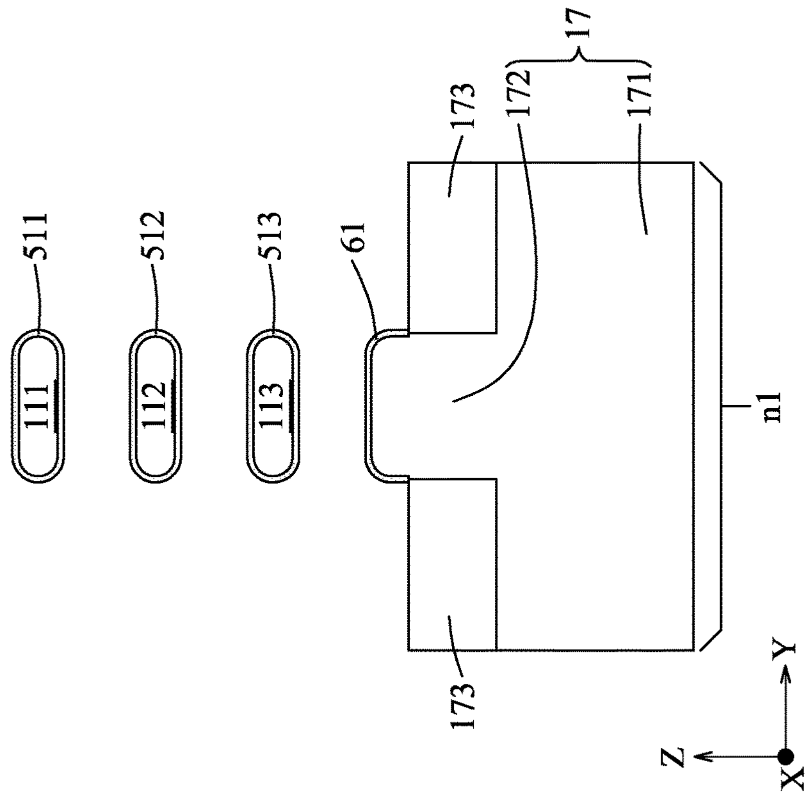
Figure 9A:
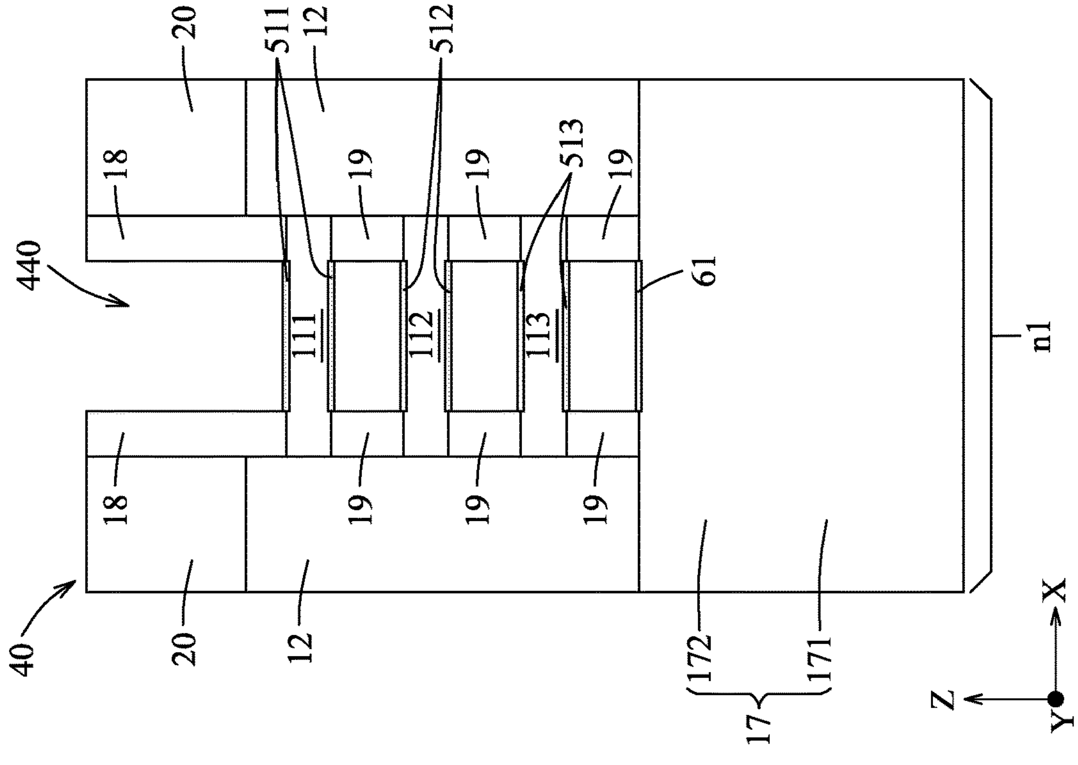
Figure 19:
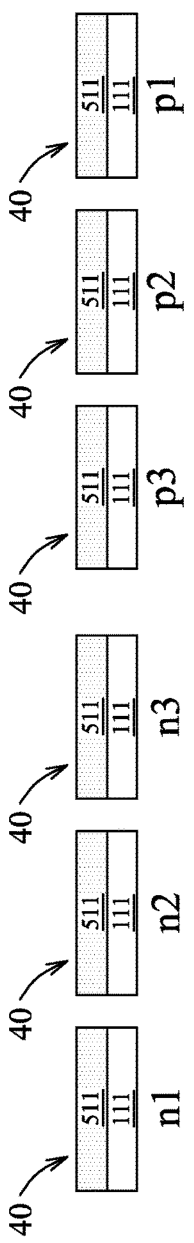

Referring to FIG. 3 and the examples illustrated in FIGS. 9A, 9B and 19, the method 30 proceeds to step 306, where at each of the patterned structures 40 of the regions n1, n2, n3, p1, p2, p3, three first oxide films 511, 512, 513 are respectively formed on the channel portions 111, 112, 113. FIGS. 9A and 9B are schematic sectional views respectively similar to FIGS. 8A and 8B, but illustrating the structures after step 306. FIG. 19 is a schematic view respectively similar to FIG. 18, but illustrating the structure after step 306.

In some embodiments, each of the first oxide films 511, 512, 513 may serve as a buffer layer for facilitating growth and improving the film quality of a layer to be subsequently formed thereon. In some embodiments, the first oxide films 511, 512, 513 may be formed by a wet chemical oxidation process. In this case, surface portions of the channel portions 111, 112, 113 are oxidized to form the first oxide films 511, 512, 513, and the first oxide films 511, 512, 513 include silicon oxide. In some embodiments, each of the first oxide films 511, 512, 513 has a thickness ranging from about 7 Å to about 10 Å. In some embodiments, at each of the regions n1, n2, n3, p1, p2, p3, a surface portion of the fin portion 172 may be also oxidized simultaneously to form an oxide layer 61 (e.g., a silicon oxide layer) during formation of the first oxide films 511, 512, 513.

In some other embodiments, formation of each of the first oxide films 511, 512, 513 may include (i) forming a preformed silicon oxide layer (not shown) by the wet chemical oxidation process, and (ii) thinning down the preformed silicon oxide layer by an etching back process, so as to adjust the thickness of each of the first oxide films 511, 512, 513 to have a desired value. In some embodiments, the wet chemical oxidation process may include a step of standard clean 1 (SC1), a step of standard clean 2 (SC2), and a cleaning step using ozonated deionized wafer. In some embodiments, the step of SC1 is performed using a solution including mixture of ammonia water and hydrogen peroxide water. In some embodiments, the step of SC2 is performed using a solution including mixture of hydrochloric acid and hydrogen peroxide water. Other wet chemical oxidation processes suitable for forming the first oxide films 511, 512, 513 are within the contemplated scope of the present disclosure. In some embodiments, the etching back process utilizes an etching gas (e.g., hydrogen fluoride gas) to thin down the preformed silicon oxide layer obtained after the wet chemical oxidation process. As such, each of the first oxide films 511, 512, 513 has a thickness ranging from about 4 Å to about 7 Å.

In yet some other embodiments, oxygen plasma may be used to oxidize the surface portions of the channel portions 111, 112, 113 to form the first oxide films 511, 512, 513. It is noted that since the first oxide films 511, 512, 513 is formed under a relatively low pressure in comparison with the wet chemical oxidation process, the thickness of the first oxide films 511, 512, 513 may be controlled to have a relatively small value, and thus the etching back process may be omitted. In some embodiments, each of the first oxide films 511, 512, 513 is controlled to have a thickness ranging from about 4 Å to about 7 Å. Other suitable techniques suitable for forming the first oxide films 511, 512, 513 are within the contemplated scope of the present disclosure.

Figure 10B:
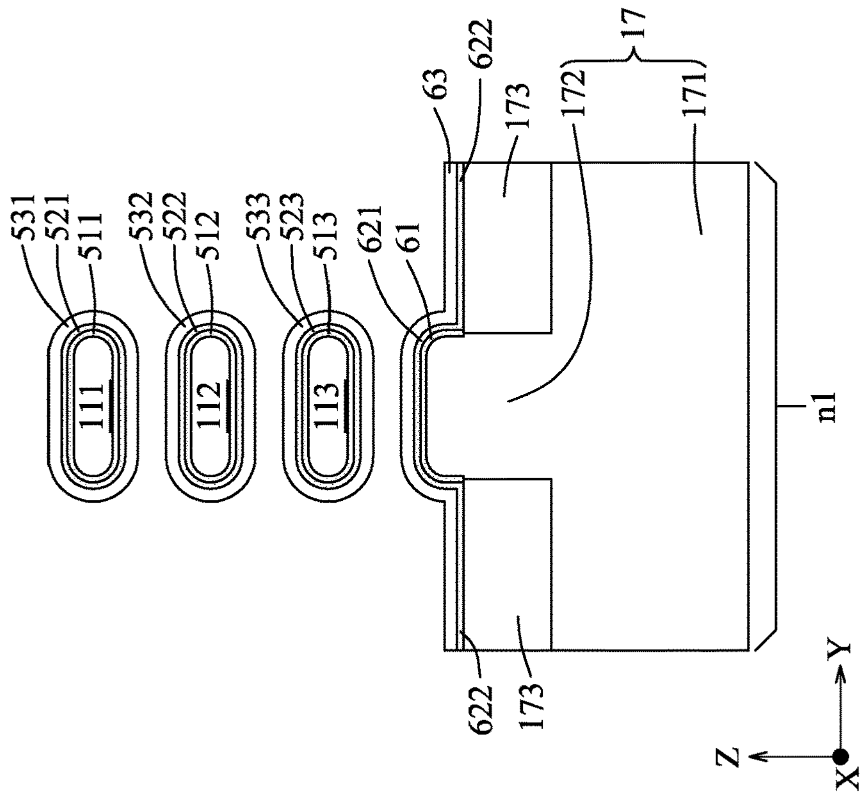
Figure 10A:
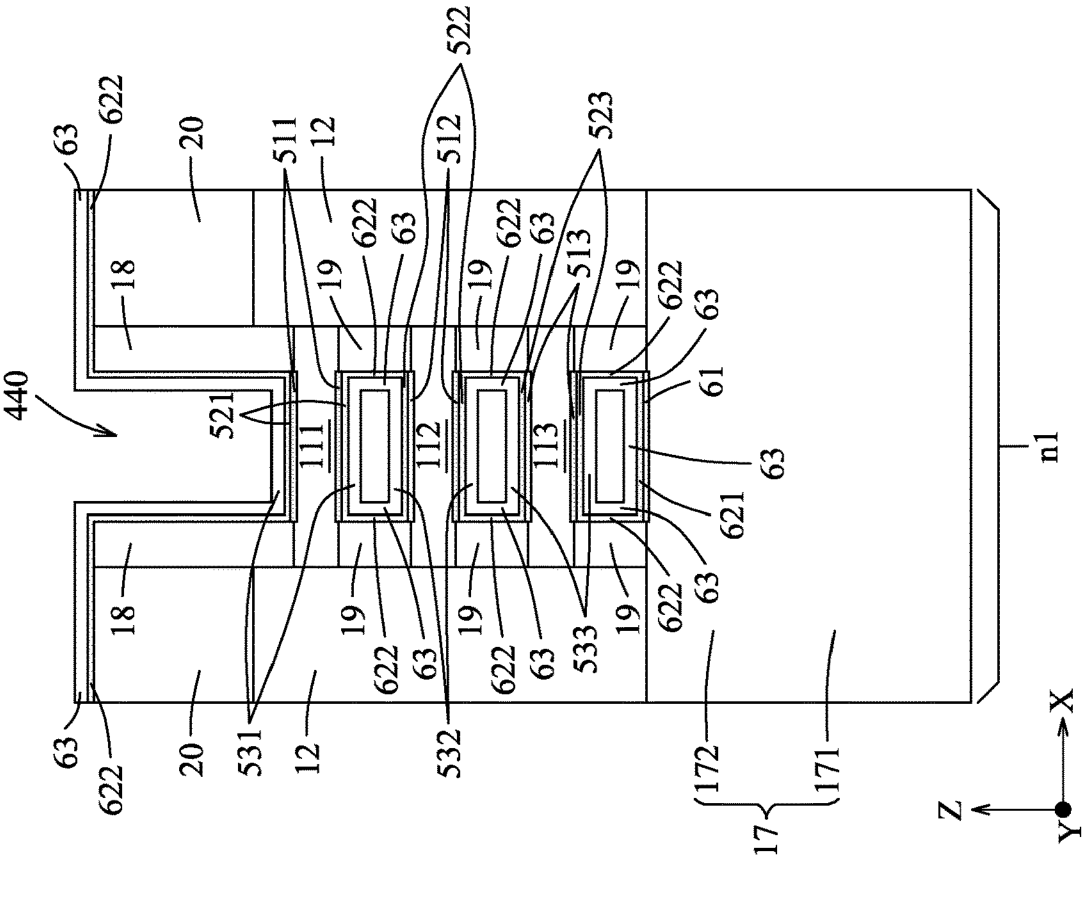
Figure 20:
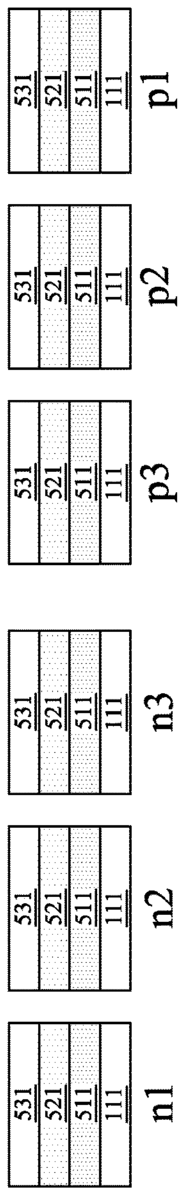

Referring to FIG. 3 and the examples illustrated in FIGS. 10A, 10B and 20, the method 30 proceeds to step 307, where at each of the regions n1, n2, n3, p1, p2, p3, three second oxide films 521, 522, 523 are respectively formed on the first oxide films 511, 512, 513, and three cap layers 531, 532, 533 are respectively formed on the second oxide films 521, 522, 523. FIGS. 10A and 10B are schematic sectional views respectively similar to FIGS. 9A and 9B, but illustrating the structures after step 307. FIG. 20 is a schematic view respectively similar to FIG. 19, but illustrating the structure after step 307.

In some embodiments, each of the second oxide films 521, 522, 523 includes rare-earth metal. For example, each of the second oxide films 521, 522, 523 includes scandium (Sc), yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), or combinations thereof. In some embodiments, each of the second oxide films 521, 522, 523 includes rare-earth metal oxide, such as oxide of scandium (Sc), yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), or combinations thereof. In some embodiments, each of the second oxide films 521, 522, 523 includes yttrium oxide, gadolinium oxide, cerium oxide, lanthanum oxide, lutetium oxide, or combinations thereof. In some embodiments, each of the second oxide films 521, 522, 523 has a lattice constant that is an integer multiple of a lattice constant of the semiconductor material of each of the channel portions 111, 112, 113. For example, each of silicon and yttrium oxide has a cubic structure, and the lattice constant of yttrium oxide is substantially two times the lattice constant of silicon. Gadolinium oxide has a cubic structure, and the lattice constant of gadolinium oxide is substantially two times the lattice constant of silicon. Cerium oxide has a cubic structure, and the lattice constant of cerium oxide is substantially the same as the lattice constant of silicon. Lutetium oxide has a cubic structure, and the lattice constant of lutetium oxide is substantially two times the lattice constant of silicon. In some other embodiments, the rare-earth metal oxide which has a lattice constant that is three times the lattice constant of the semiconductor material of each of the channel portions 111, 112, 113 may be suitable for forming each of the second oxide films 521, 522, 523. Each of the interfacial layers 131, 132, 133 (see FIGS. 11A and 11B), which is formed on a corresponding one of the channel portions 111, 112, 113, is obtained by the reaction between one of the first oxide films 511, 512, 513 and a corresponding one of the second oxide films 521, 522, 523. In addition, the lattice constant of each of the second oxide films 521, 522, 523 is designed to be an integer multiple of the lattice constant of the semiconductor material of each of the channel portions 111, 112, 113. As such, each of the interfacial layers 131, 132, 133 may be formed on a corresponding one of the channel portions 111, 112, 113 with less lattice defects (e.g., dislocation, distortion, etc.) at an interface therebetween. In some embodiments, each of the second oxide films 521, 522, 523 has a thickness ranging from about 3 Å to about 10 Å. In some embodiments, formation of the second oxide films 521, 522, 523 may be performed by CVD, ALD, or other suitable deposition techniques.

In some embodiments, the second oxide films 521, 522, 523 are formed by conformally depositing a rare-earth metal oxide material on the first oxide films 511, 512, 513 at each of the regions n1, n2, n3, p1, p2, p3 (only the n-region n1 is shown in FIGS. 10A and 10B). In such case, in addition to the first oxide films 511, 512, 513 at each of the regions n1, n2, n3, p1, p2, p3, the rare-earth oxide material may also cover the two gate spacers 18, the multiple pairs of the inner spacers 19, the two ILD portions 20, the two isolation portions 173 and the oxide layer 61 to form a first portion 621 on the oxide layer 61, and second portions 622 on the elements 18, 19, 20, 173.

In some embodiments, each of the cap layers 531, 532, 533 includes silicon. The cap layers 531, 532, 533 serve to prevent oxygen in the ambient air from diffusing toward the channel portions 111, 112, 113, respectively. In some embodiments, each of the cap layers 531, 532, 533 has a thickness ranging from about 10 Å to about 15 Å. In some embodiments, formation of the cap layers 531, 532, 533 may be performed by CVD, ALD, or other suitable deposition techniques.

In some embodiments, during formation of the cap layers 531, 532, 533, the silicon material may be conformally deposited on the rare-earth metal oxide material at each of the regions n1, n2, n3, p1, p2, p3. That is, at each of the regions n1, n2, n3, p1, p2, p3, the silicon material may also cover the elements 621, 622 in addition to the second oxide films 521, 522, 523. As shown in FIGS. 10A and 10B, portions of the silicon material that is formed on the elements 621, 622 are denoted by the numeral 63.

Figure 11B:
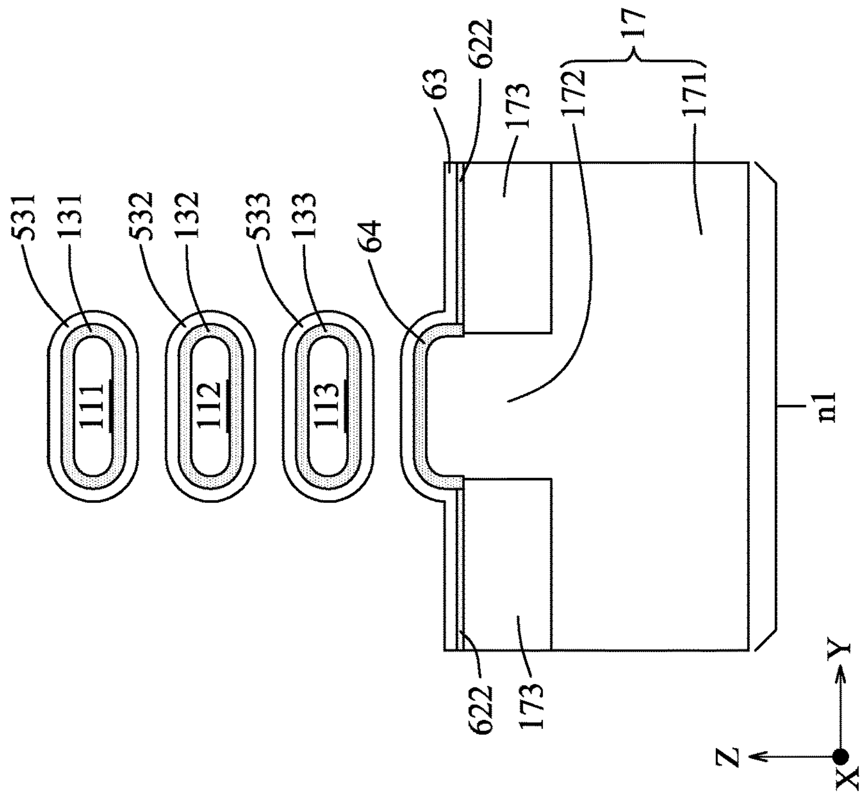
Figure 11A:
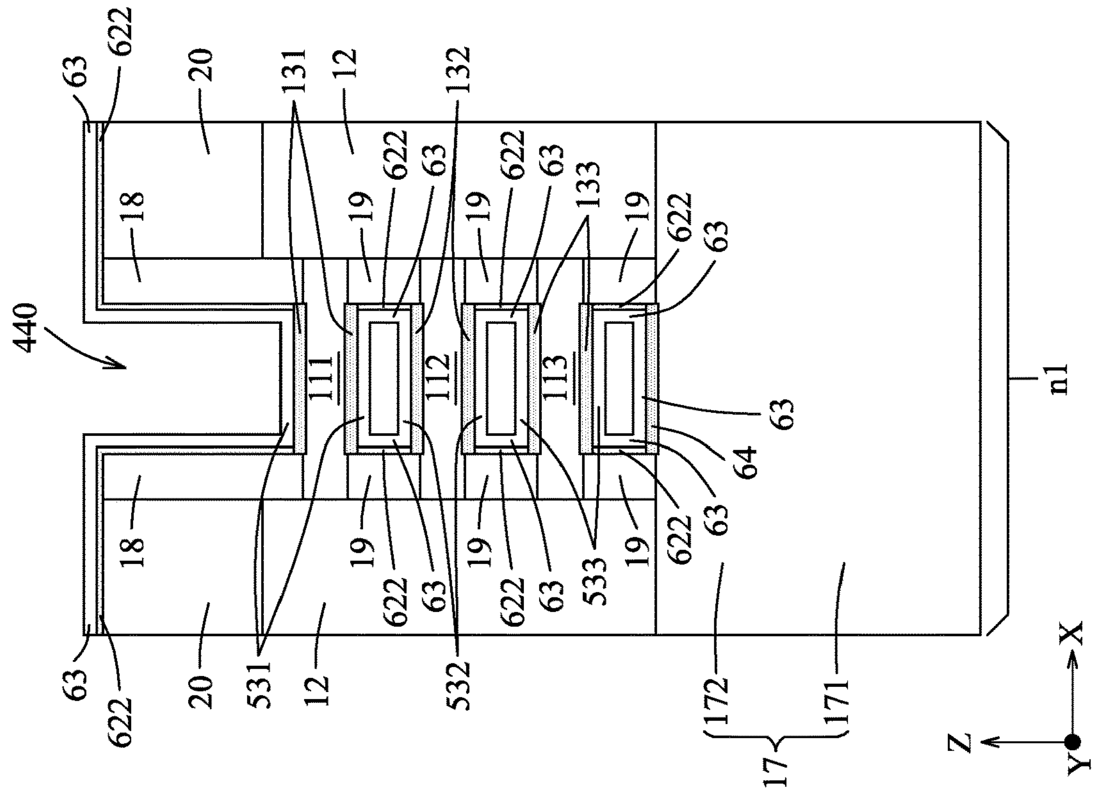
Figure 21:
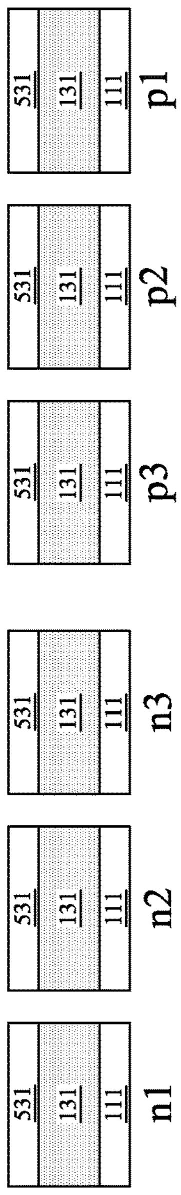

Referring to FIG. 3 and the examples illustrated in FIGS. 11A, 11B and 21, the method 30 proceeds to step 308, where at each of the regions n1, n2, n3, p1, p2, p3, a treatment is performed such that each of the first oxide films 511, 512, 513 and a corresponding one of the second oxide films 521, 522, 523 are formed into a corresponding one of the interfacial layers 131, 132, 133. FIGS. 11A and 11B are schematic sectional views respectively similar to FIGS. 10A and 10B, but illustrating the structures after step 308. FIG. 21 is a schematic view respectively similar to FIG. 20, but illustrating the structure after step 308.

In some embodiments, the treatment includes a thermal process such as laser spike annealing (LSA), dynamic scan annealing (DSA), or other suitable annealing techniques. In some embodiments, the thermal process is performed at a temperature ranging from about 850° C. to about 1200° C. In some embodiments, during the thermal process, the rare-earth metal oxide of the second oxide films 521, 522, 523 will react with the silicon oxide of the first oxide films 511, 512, 513 so as to form the first dielectric material (e.g., rare-earth metal silicate) of the interfacial layers 131, 132, 133. In some embodiments, the first oxide films 511, 512, 513 and the second oxide films 521, 522, 523 may be completely reacted and completely converted into the interfacial layers 131, 132, 133 during the thermal process. In some other embodiments, when each of the first oxide films 511, 512, 513 has an excessive thickness, a portion of each of the first oxide films 511, 512, 513 may not react during the thermal process, and may remain between one of the interfacial layers 131, 132, 133 and a corresponding one of the channel portions 111, 112, 113. Therefore, in order to allow the first oxide films 511, 512, 513 and the second oxide films 521, 522, 523 to react completely, the thickness of the first oxide films 511, 512, 513 may be adjusted according to the thickness of the second oxide films 521, 522, 523.

In some embodiments, during the thermal process, the first portion 621 of the rare-earth metal oxide material (see FIG. 10B) may also react with the oxide layer 61 to form a rare-earth metal oxide layer 64 on the fin portion 172 at each of the regions n1, n2, n3, p1, p2, p3. In some embodiments, in step 308, each of the second portions 622 of the rare-earth metal oxide material (see FIGS. 10B and 11B) may react or may not react with the element disposed therebeneath.

In some embodiments, during the thermal process, the cap layers 531, 532, 533 may be oxidized to trap oxygen in the ambient air that tends to diffuse toward the channel portions 111, 112, 113. In some embodiments, during the reaction between the first oxide films 511, 512, 513 and the second oxide films 521, 522, 523, the provision of the cap layers 531, 532, 533 may catch excess oxygen atoms from the first and second oxide films 511, 512, 513, 521, 522, 523, thereby preventing silicon oxide from being newly generated during the thermal process. The newly generated silicon oxide may unduly increase the EOT value and CET value of each of the interfacial layers 131, 132, 133 obtained in this step.

Figure 12B:
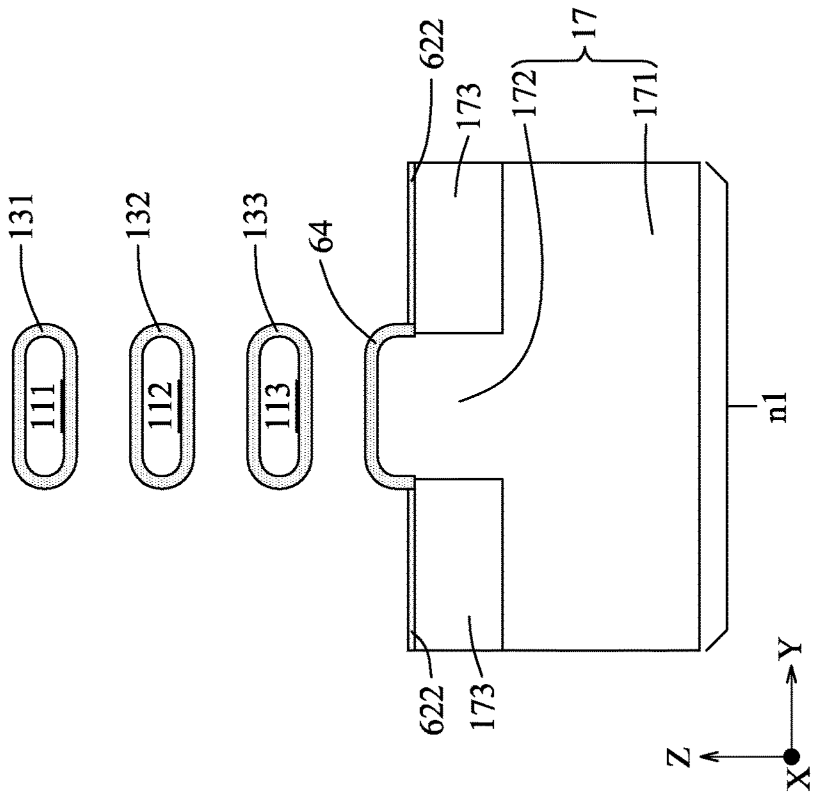
Figure 12A:
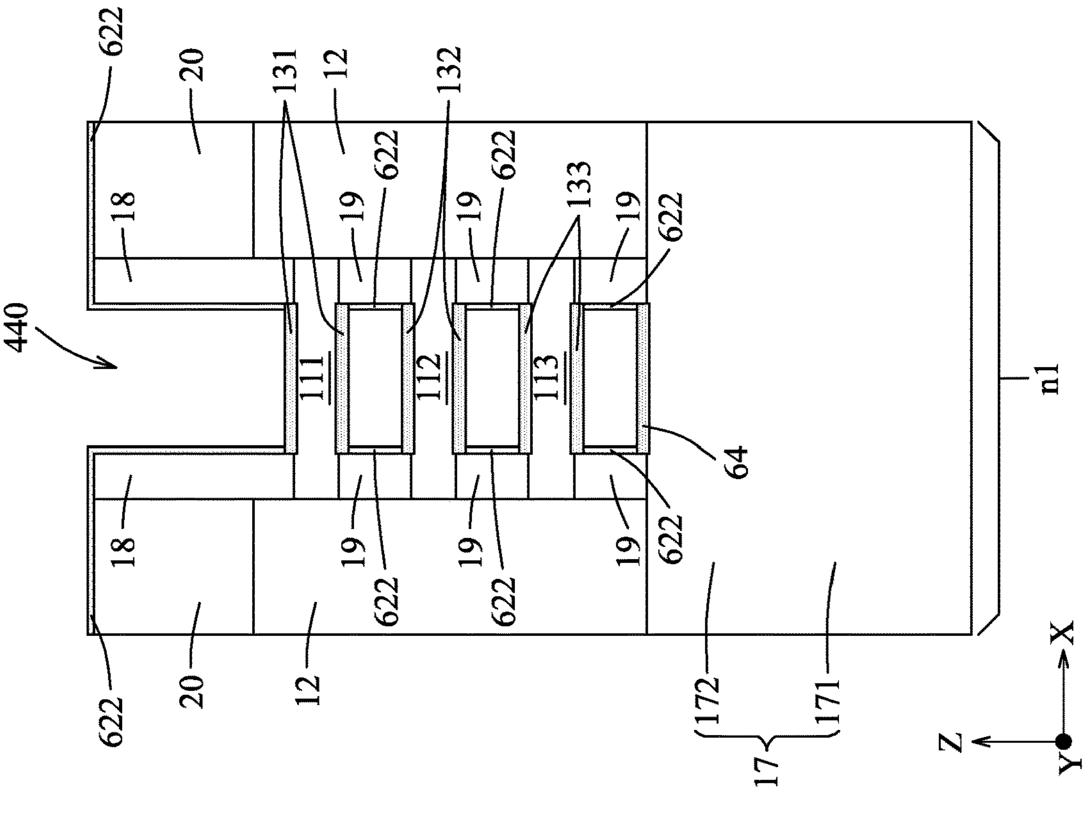
Figure 22:
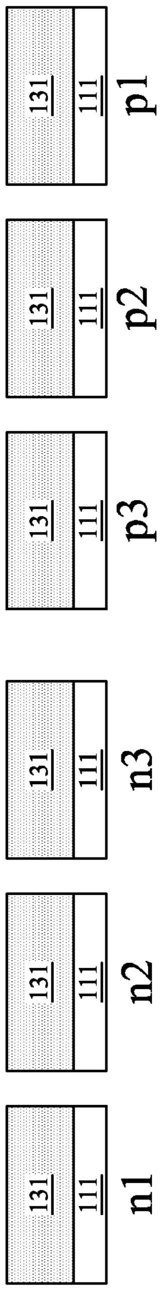

Referring to FIG. 3 and the examples illustrated in FIGS. 12A, 12B and 22, the method 30 proceeds to step 309, where at each of the regions n1, n2, n3, p1, p2, p3, the cap layers 531, 532, 533 (see FIGS. 11A, 11B and 21) are removed. FIGS. 12A and 12B are schematic sectional views respectively similar to FIGS. 11A and 11B, but illustrating the structures after step 309. FIG. 22 is a schematic view respectively similar to FIG. 21, but illustrating the structure after step 309.

In some embodiments, the removal of the cap layers 531, 532, 533 may be performed by an etching process such as dry etching, wet etching, other suitable etching techniques, or combinations thereof. In some embodiments, the portions 63 of the silicon material (see FIGS. 11A and 11B) may be also removed together with the removal of the cap layers 531, 532, 533.

Figure 13B:
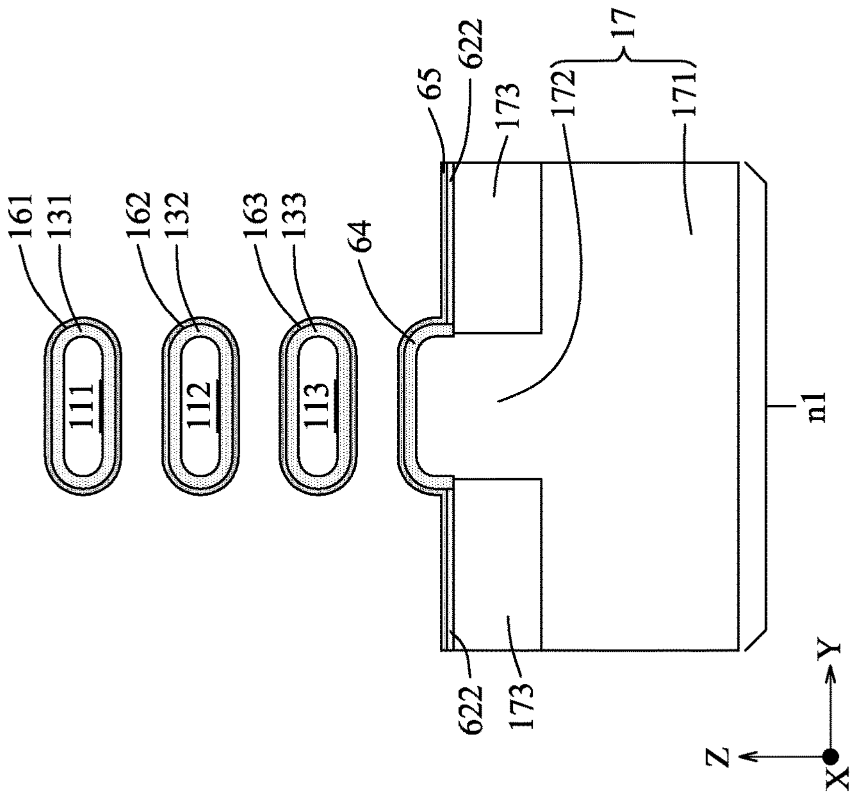
Figure 13A:
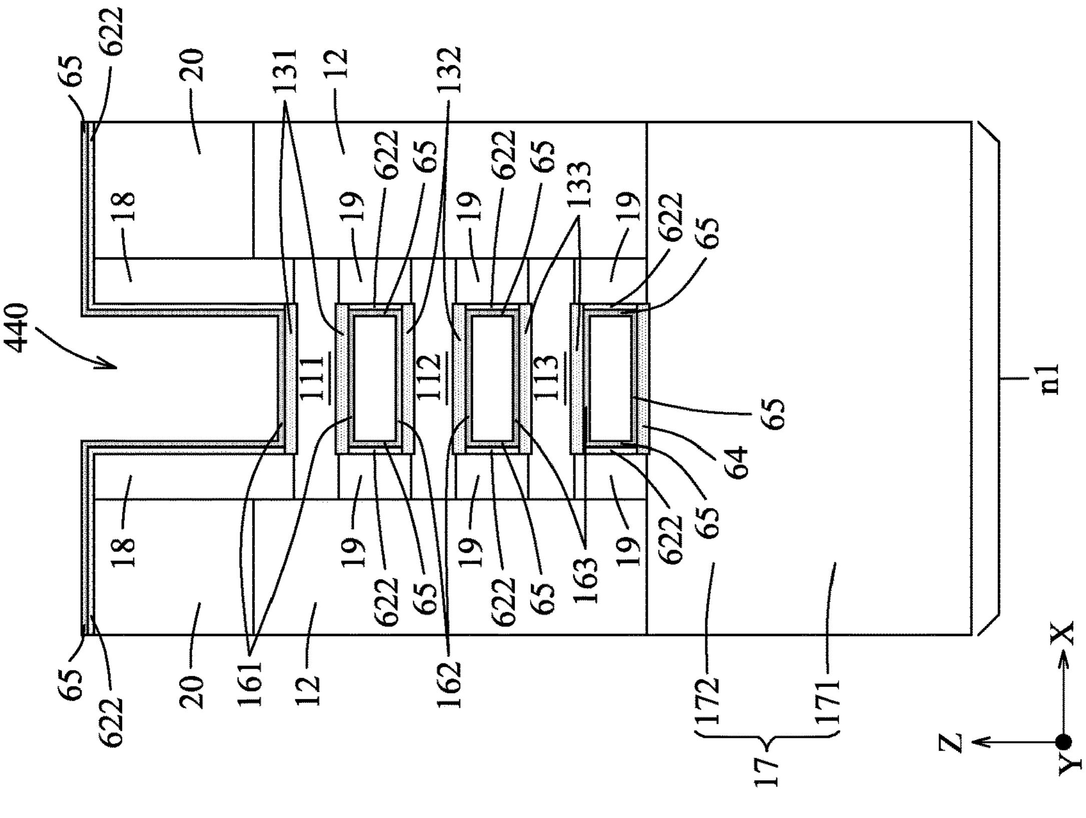
Figure 23:
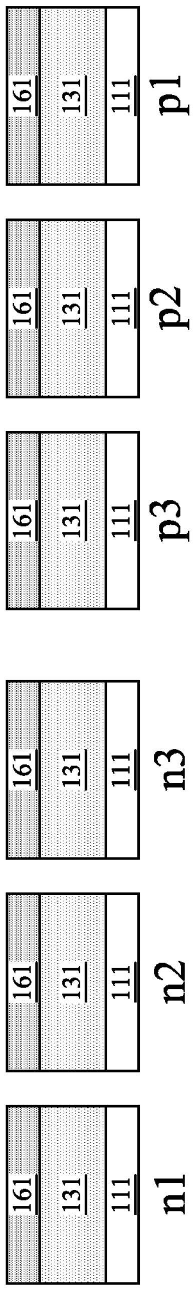

Referring to FIG. 3 and the examples illustrated in FIGS. 13A, 13B and 23, the method 30 proceeds to step 310, where at each of the regions n1, n2, n3, p1, p2, p3, the barrier layers 161, 162, 163 are formed on the interfacial layers 131, 132, 132, respectively. FIGS. 13A and 13B are schematic sectional views respectively similar to FIGS. 12A and 12B, but illustrating the structures after step 310. FIG. 23 is a schematic view respectively similar to FIG. 22, but illustrating the structure after step 310.

Since the material and thickness of each of the barrier layers 161, 162, 163 have been described above with reference to FIGS. 1A and 1B, and thus the details thereof are not repeated herein for the sake of brevity. In some embodiments, formation of the barrier layers 161, 162, 163 may include CVD, ALD or other suitable deposition techniques.

In some embodiments, the barrier layers 161, 162, 163 is formed by conformally depositing the barrier material for forming the barrier layers 161, 162, 163 on the structure shown in FIGS. 12A and 12B. In such case, in addition to the interfacial layers 131, 132, 132 at each of the regions n1, n2, n3, p1, p2, p3, the barrier material for forming the barrier layers 161, 162, 163 may also cover the elements 622, 64 to form portions 65.

Figure 14B:
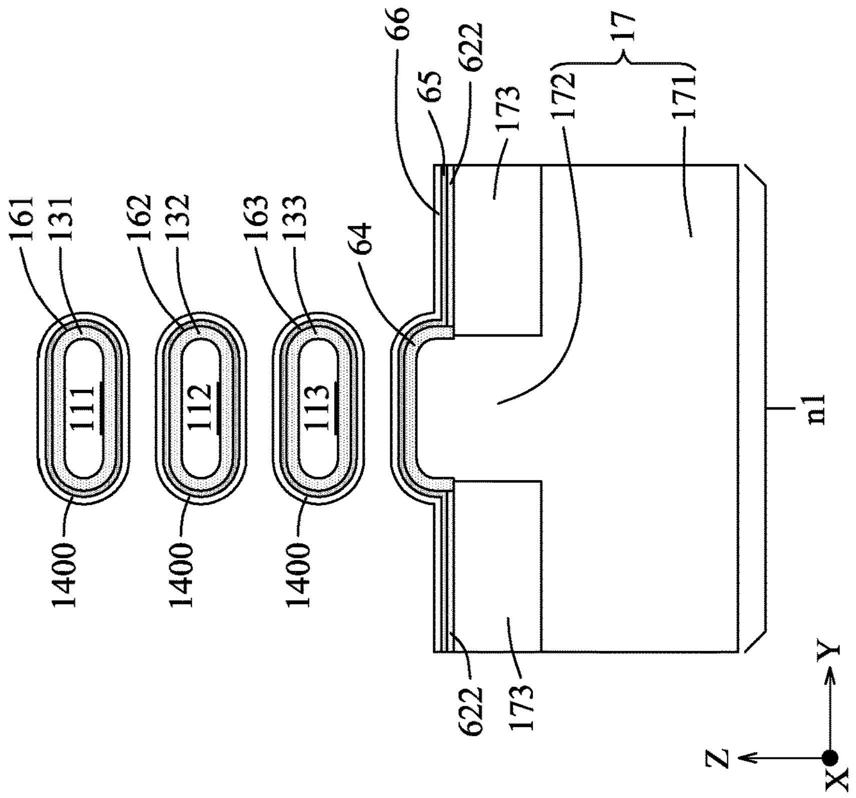
Figure 14A:
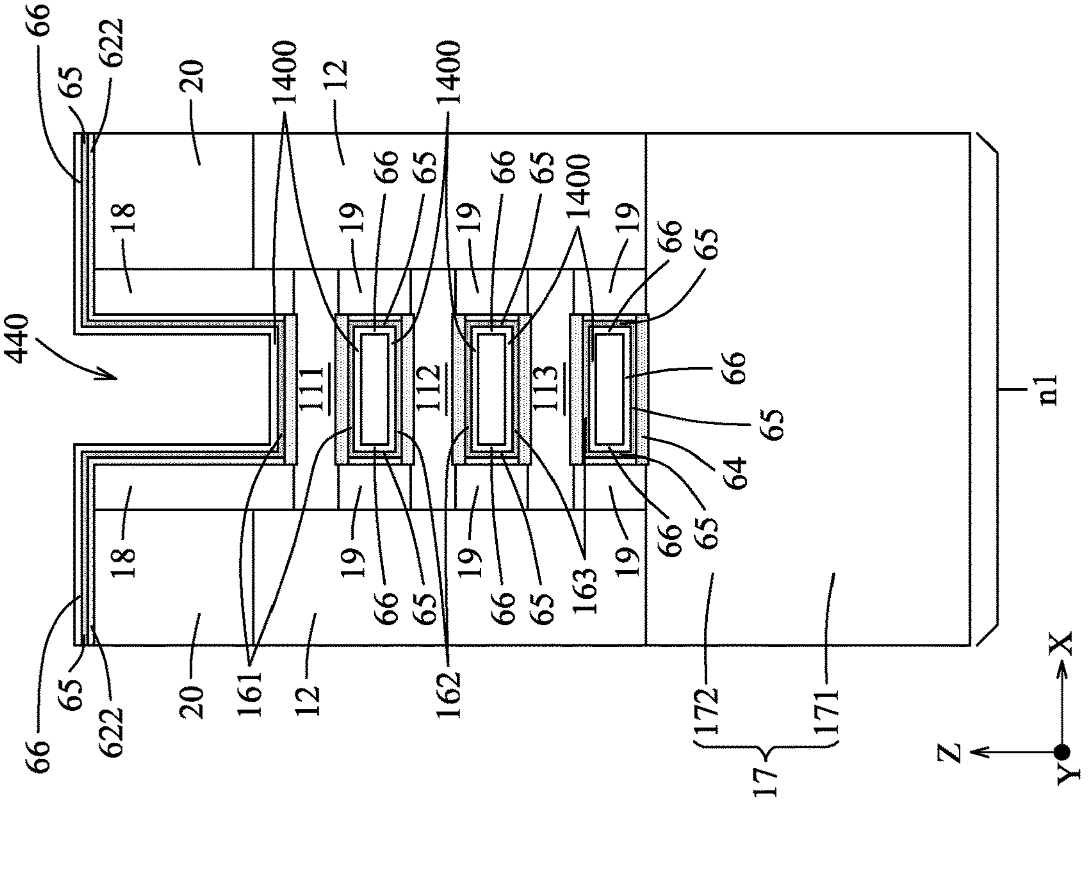
Figure 24:
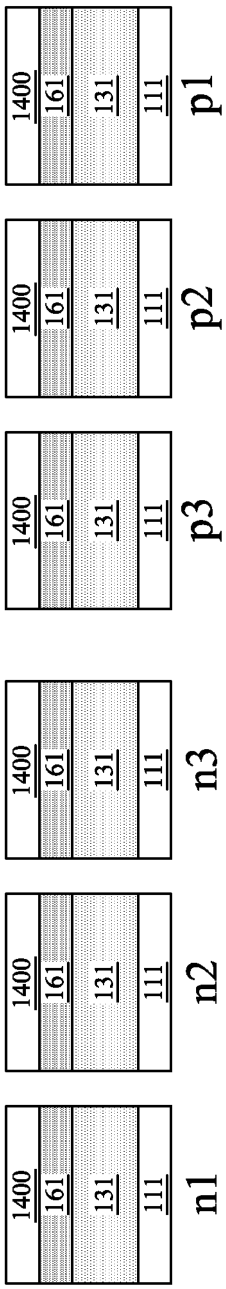

Referring to FIG. 3 and the examples illustrated in FIGS. 14A, 14B and 24, the method 30 proceeds to step 311, where at each of the regions n1, n2, n3, p1, p2, p3, a first sub-layer 1400 for forming each of the gate dielectric layers 141, 142, 143 is formed on a corresponding one of the barrier layers 161, 162, 163. FIGS. 14A and 14B are schematic sectional views respectively similar to FIGS. 13A and 13B, but illustrating the structures after step 311. FIG. 24 is a schematic view respectively similar to FIG. 23, but illustrating the structure after step 311.

In some embodiments, the first sub-layer 1400 includes the second dielectric material as described above with reference to FIGS. 1A and 1B. In some embodiments, the first sub-layer 1400 has a thickness ranging from about 6 Å to about 15 Å. In some embodiments, formation of the first sub-layer 1400 may include CVD, ALD or other suitable deposition techniques.

In some embodiments, the first sub-layer 1400 for forming each of the gate dielectric layers 141, 142, 143 is formed by conformally depositing the second dielectric material on the structure shown in FIGS. 13A and 13B. In such case, in addition to the barrier layers 161, 162, 163 at each of the regions n1, n2, n3, p1, p2, p3, the second dielectric material may also cover the elements 65 to form portions 66.

Figure 15B:
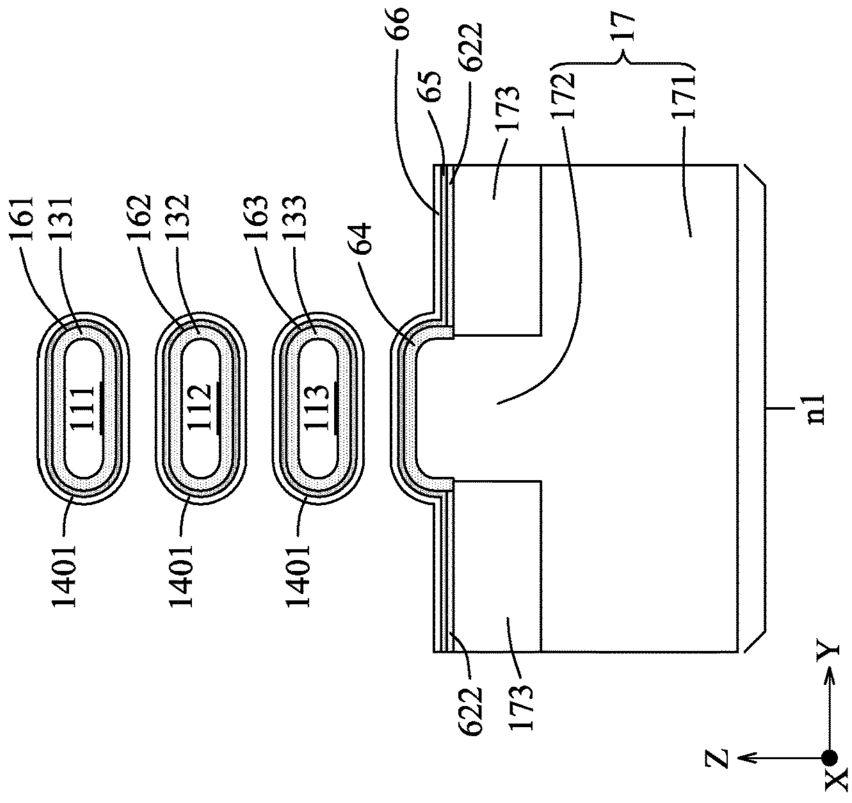
Figure 15A:
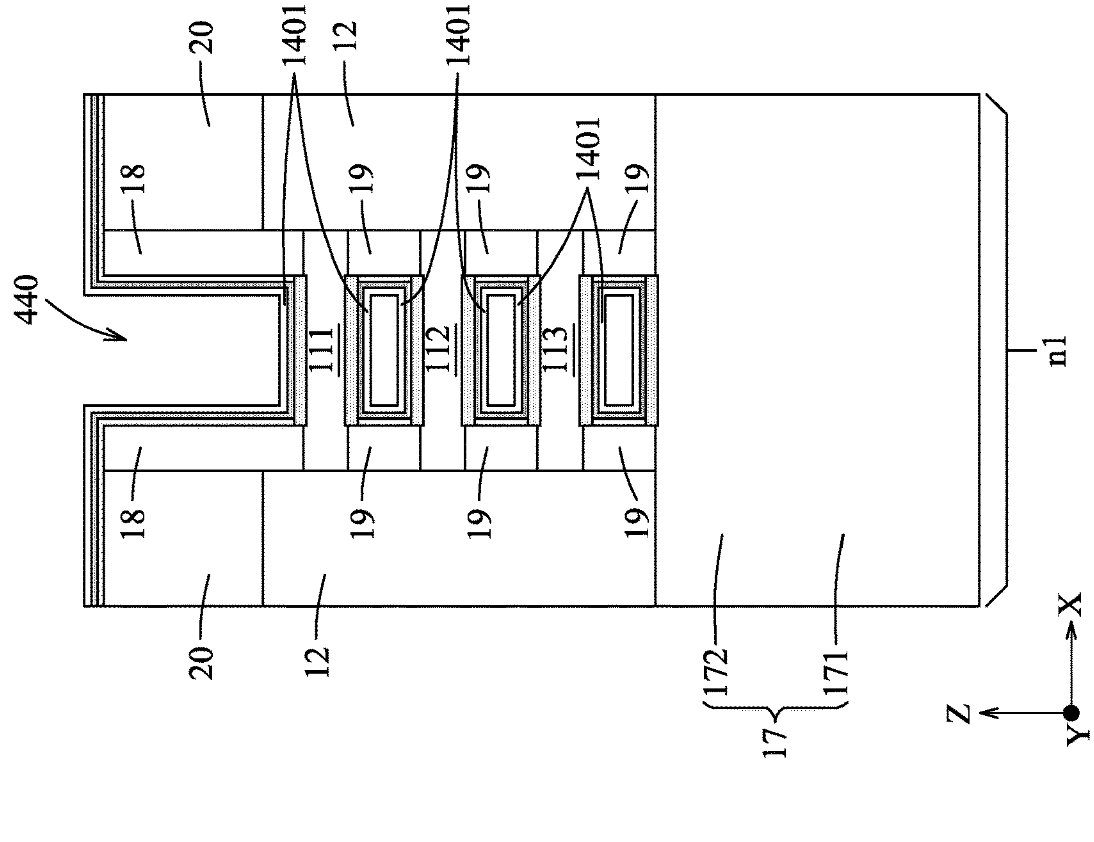
Figure 32:
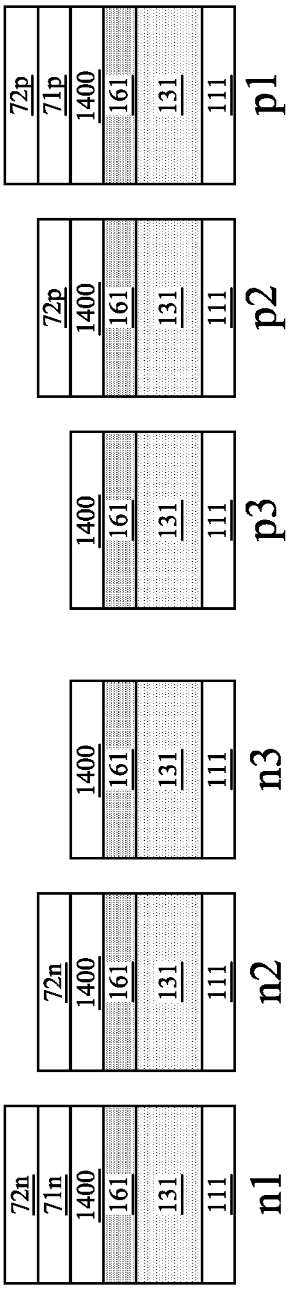
Figure 33:
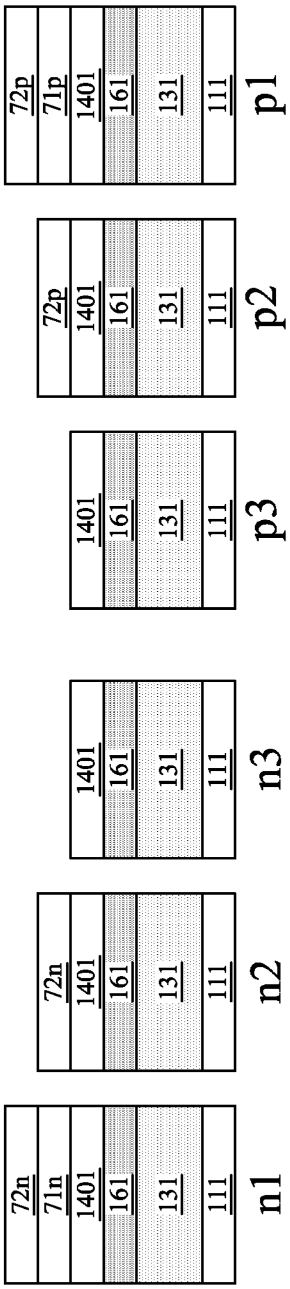
Figure 34:
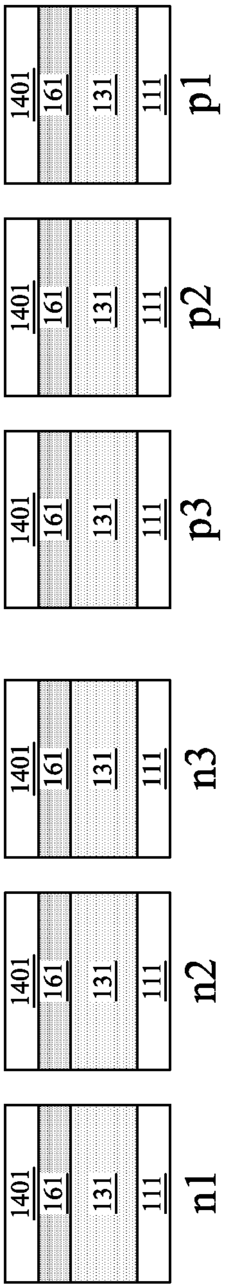

Referring to FIG. 3 and the examples illustrated in FIGS. 15A, 15B and 25 to 34, the method 30 proceeds to step 312, where a dipole process is performed to obtain a treated first sub-layer 1401 of each of the gate dielectric layers 141, 142, 143 at each of the regions n1, n2, n3, p1, p2, p3. FIGS. 15A and 15B are schematic sectional views respectively similar to FIGS. 14A and 14B, but illustrating the structures after step 312. FIG. 34 is a schematic view respectively similar to FIG. 24, but illustrating the structure after step 312.

In some embodiments, the dipole process may include multiple sub-steps which are described hereafter with reference to FIGS. 25 to 34.

Figure 25:
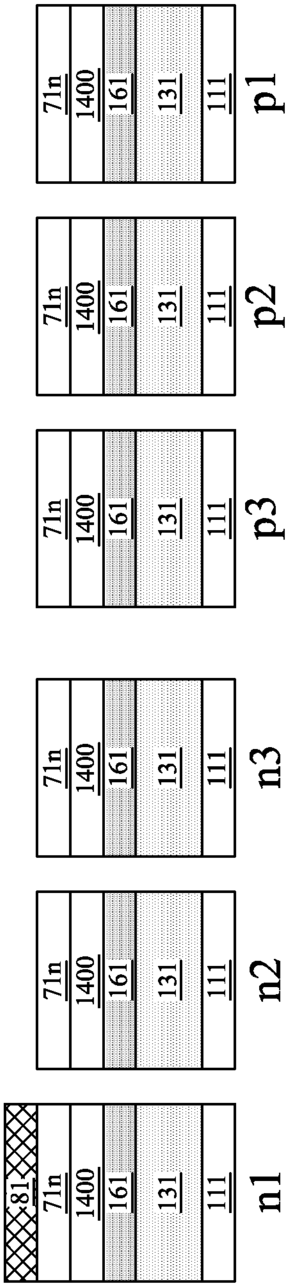

Referring to FIG. 25 which is a schematic view subsequent to FIG. 24, at each of the regions n1, n2, n3, p1, p2, p3, an n-dipole layer 71*n* is formed on the first sub-layer 1400 of each of the gate dielectric layers 141, 142, 143 (see also FIGS. 14A and 14B), and then a patterned photoresist layer 81 is formed on the n-dipole layer 71*n* at the n-region n1.

The n-dipole layer 71*n* and other dipole layers to be described below serve as a source that provides the dipole elements to be diffused into the interfacial layers 131, 132, 133 and/or the first sub-layer 1400 of each of the gate dielectric layers 141, 142, 143. In some embodiments, the n-dipole layer 71*n* includes n-dipole elements such as lanthanum (La), lutetium (Lu), scandium (Sc), yttrium (Y), thulium (Tm), gadolinium (Gd), or combinations thereof. In some embodiments, the n-dipole layer 71*n* includes a metal oxide, a metal nitride, a metal carbide, a metal oxynitride, or combinations thereof, each of which includes the above-mentioned n-dipole elements. In some embodiments, when lanthanum is selected as the n-dipole elements, the n-dipole layer 71*n* may be made of lanthanum oxide, lanthanum nitride, lanthanum oxynitride, but is not limited thereto. In some other embodiments, the n-dipole layer 71*n* may be made of lutetium oxide, scandium oxide, yttrium oxide, thulium oxide, gadolinium oxide, or combinations thereof. Other materials suitable for the n-dipole layer 71*n* are within the contemplated scope of the present disclosure. In some embodiments, the n-dipole layer 71*n* has a thickness ranging from about 0.5 Å to about 25 Å. In some embodiments, the n-dipole layer 71*n* may be formed using CVD, ALD, or other suitable deposition techniques.

In some embodiments, the patterned photoresist layer 81 may be formed by spin-coating a photoresist layer (not shown) on the n-dipole layer 71*n* at each of the regions n1, n2, n3, p1, p2, p3, and patterning the photoresist layer to expose the n-dipole layer 71*n* at each of the regions n2, n3, p1, p2, p3 by a lithography technique including exposure and developing processes. Other suitable processes for forming the patterned photoresist layer 81 are within the contemplated scope of the present disclosure.

Figure 26:
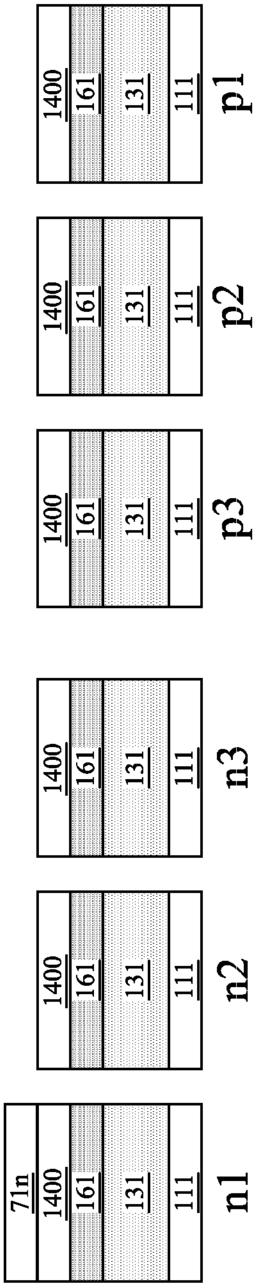

Referring to FIG. 26 which is a schematic view subsequent to FIG. 25, the n-dipole layer 71*n* at each of the regions n2, n3, p1, p2, p3 (see FIG. 25) is removed by a wet etching process and/or a dry etching process, and then the patterned photoresist layer 81 (see FIG. 25) is removed by a stripping process and/or an etching process.

In some embodiments, the wet etching process used for the removal of the n-dipole layer 71*n* at each of the regions n2, n3, p1, p2, p3 may utilize one or more wet etchant solutions which have a higher etching selectivity (or higher etching rate) over the n-dipole layer 71*n* than the first sub-layer 1400 so that the first sub-layer 1400 located beneath the n-dipole layer 71*n* at each of the regions n2, n3, p1, p2, p3 is substantially not removed or damaged. In some embodiments, the wet etchant solution may include $NH_4OH$, $H_2SO_4$, $H_2O_2$, HCl, $H_2O$, HF, $HNO_3$, diluted HF, $O_3$, $H_3PO_4$, other suitable chemical solutions, or combinations thereof, but is not limited thereto.

Figure 27:
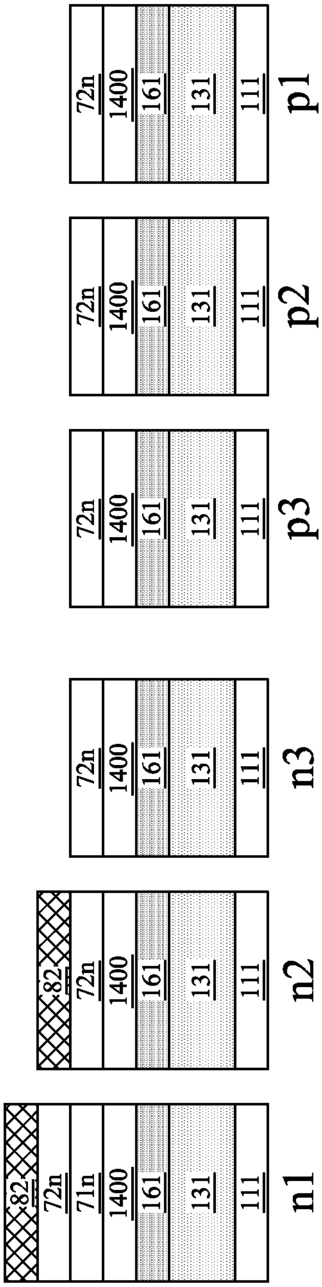

Referring to FIG. 27 which is a schematic view subsequent to FIG. 26, an n-dipole layer 72*n* is formed on the structure at each of the regions n1, n2, n3, p1, p2, p3, and then a patterned photoresist layer 82 is formed on the n-dipole layer 72*n* at the n-regions n1, n2.

In some embodiments, possible materials and thickness suitable for the n-dipole layer 72*n* are similar to those for the n-dipole layer 71*n* as described above with reference to FIG. 25, and thus the details thereof are omitted for the sake of brevity. In some embodiments, the material or thickness of the n-dipole layer 72*n* may be the same as or different from the material or thickness of the n-dipole layer 71*n*.

The n-dipole layer 72*n* and the patterned photoresist layer 82 are formed in a manner similar to the manner for forming the n-dipole layer 71*n* and the patterned photoresist layer 81 as described above with reference to FIG. 25, and thus the details thereof are omitted for the sake of brevity.

Figure 28:
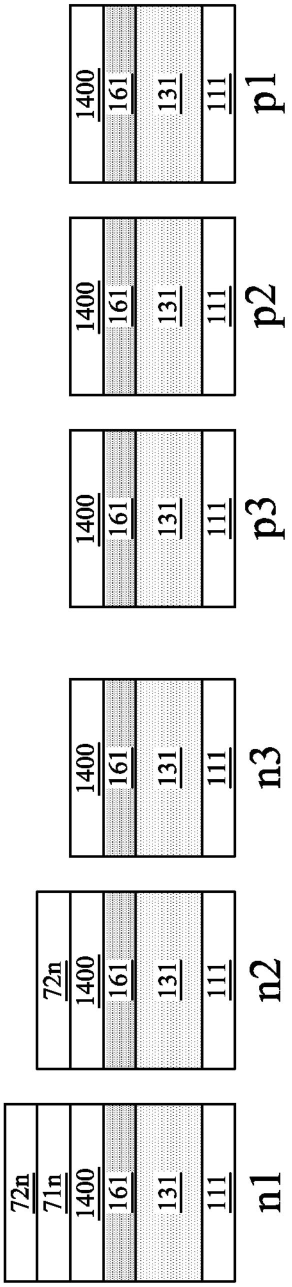

Referring to FIG. 28 which is a schematic view subsequent to FIG. 27, the n-dipole layer 72*n* at each of the regions n3, p1, p2, p3 (see FIG. 27) is removed by a wet etching process and/or a dry etching process, and then the patterned photoresist layer 82 (see FIG. 27) is removed by a stripping process and/or an etching process.

The n-dipole layer 72*n* and the patterned photoresist layer 82 are removed in a manner similar to the manner for removing the n-dipole layer 71*n* and the patterned photoresist layer 81 as described above with reference to FIGS. 25 and 26, and thus the details thereof are omitted for the sake of brevity.

Figure 29:
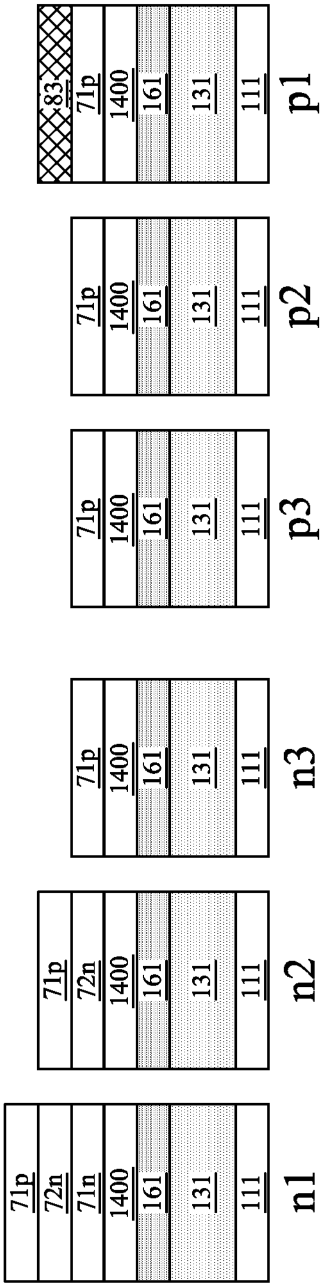

Referring to FIG. 29 which is a schematic view subsequent to FIG. 28, a p-dipole layer 71*p* is formed on the structure at each of the regions n1, n2, n3, p1, p2, p3, and then a patterned photoresist layer 83 is formed on the p-dipole layer 71*p* at the p-region p1.

In some embodiments, the p-dipole layer 71*p* includes p-dipole elements such as aluminum (Al), zinc (Zn), gallium (Ga), or combinations thereof. In some embodiments, the p-dipole layer 71*p* includes a metal oxide, a metal nitride, a metal carbide, a metal oxynitride, or combinations thereof, each of which includes the abovementioned p-dipole elements. In some embodiments, when zinc is selected as the p-dipole elements, the p-dipole layer 71*p* may be made of zinc oxide, zinc nitride, zinc oxynitride, but is not limited thereto. In some other embodiments, the p-dipole layer 71*p* may be made of aluminum oxide, gallium oxide, gallium nitride, or combinations thereof. Other materials suitable for the p-dipole layer 71*p* are within the contemplated scope of the present disclosure. In some embodiments, the p-dipole layer 71*p* has a thickness ranging from about 0.5 Å to about 25 Å.

In some embodiments, the p-dipole layer 71*p* may be formed by CVD, ALD, or other suitable deposition techniques. In some embodiments, the patterned photoresist layer 83 is formed in a manner similar to the manner for forming the patterned photoresist layer 81 as described above with reference to FIG. 25, and thus the details thereof are omitted for the sake of brevity.

Figure 30:
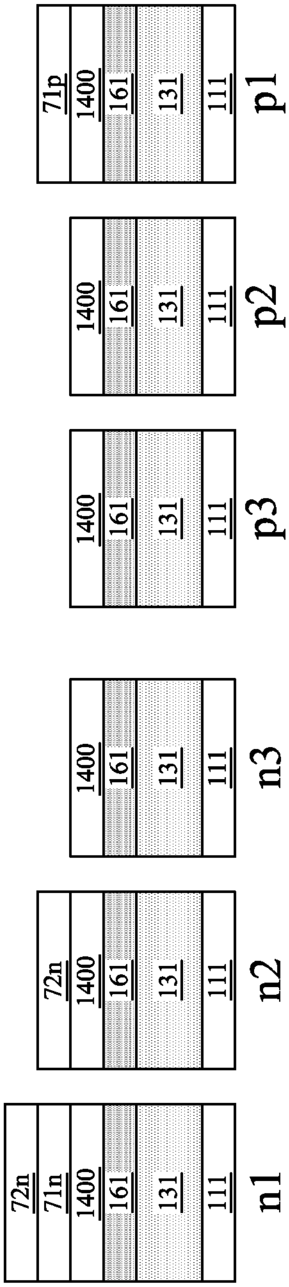

Referring to FIG. 30 which is a schematic view subsequent to FIG. 29, the p-dipole layer 71*p* at each of the regions n1, n2, n3, p2, p3 (see FIG. 29) is removed by a wet etching process and/or a dry etching process, and then the patterned photoresist layer 83 (see FIG. 29) is removed by a stripping process and/or an etching process.

The p-dipole layer 71*p* and the patterned photoresist layer 83 are removed in a manner similar to the manner for removing the n-dipole layer 71*n* and the patterned photoresist layer 81 as described above with reference to FIGS. 25 and 26, and thus the details thereof are omitted for the sake of brevity.

Figure 31:
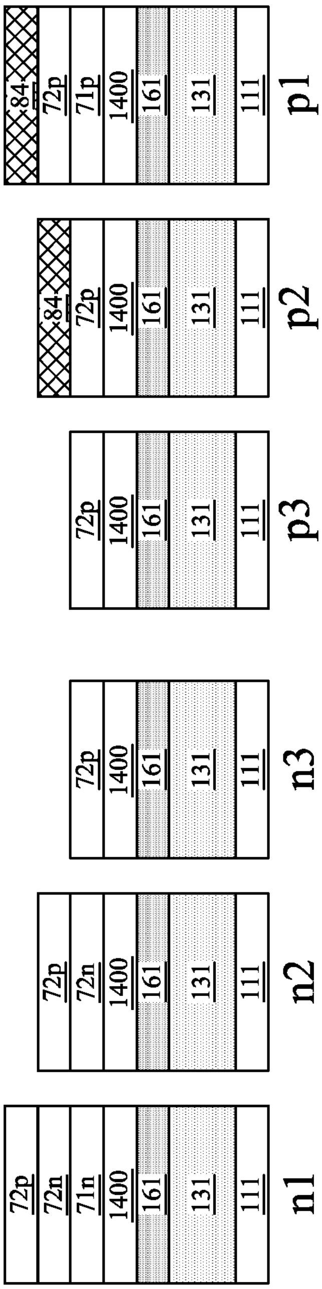

Referring to FIG. 31 which is a schematic view subsequent to FIG. 30, a p-dipole layer 72*p* is formed on the structure at each of the regions n1, n2, n3, p1, p2, p3, and then a patterned photoresist layer 84 is formed on the p-dipole layer 72*p* at the p-regions p1, p2.

In some embodiments, possible materials and thickness suitable for the p-dipole layer 72*p* are similar to those for the p-dipole layer 71*p* as described above with reference to FIG. 29, and thus the details thereof are omitted for the sake of brevity. In some embodiments, the material or thickness of the p-dipole layer 72*p* may be the same as or different from the material or thickness of the p-dipole layer 71*p*.

The p-dipole layer 72*p* and the patterned photoresist layer 84 are formed in a manner similar to the manner for forming the p-dipole layer 71*p* and the patterned photoresist layer 83 as described above with reference to FIG. 29, and thus the details thereof are omitted for the sake of brevity.

Referring to FIG. 32 which is a schematic view subsequent to FIG. 31, the p-dipole layer 72*p* at each of the regions n1, n2, n3, p3 (see FIG. 31) is removed by a wet etching process and/or a dry etching process, and then the patterned photoresist layer 84 (see FIG. 31) is removed by a stripping process and/or an etching process.

The p-dipole layer 72*p* and the patterned photoresist layer 84 are removed in a manner similar to the manner for removing the n-dipole layer 71*n* and the patterned photoresist layer 81 as described above with reference to FIGS. 25 and 26, and thus the details thereof are omitted for the sake of brevity.

Referring to FIG. 33 which is a schematic view subsequent to FIG. 32, a thermal drive-in process is performed at each of the regions n1, n2, n3, p1, p2, p3.

After the thermal drive-in process, in some embodiments, the n-dipole elements in the n-dipole layer(s) 71*n*, 72*n* are introduced into the first sub-layer 1400 for forming each of the gate dielectric layers 141, 142, 143 at each of the n-regions (e.g., n1 and n2 exemplified in FIG. 33), and the p-dipole elements in the p-dipole layer(s) 71*p*, 72*p* are introduced into the first sub-layer 1400 for forming each of the gate dielectric layers 141, 142, 143 at each of the p-regions (e.g., p1 and p2 exemplified in FIG. 33). By the thermal drive-in process, the first sub-layer 1400 at each of the regions n1, n2, n3, p1, p2, p3 (see FIG. 32) is formed into the treated first sub-layer 1401 of each of the gate dielectric layers 141, 142, 143 at each of the regions n1, n2, n3, p1, p2, p3 (see FIG. 33).

In some embodiments, the n-dipole elements in the treated first sub-layer 1401 at the n-region n1 have an atomic concentration that is greater than an atomic concentration of the n-dipole elements in the treated first sub-layer 1401 at the n-region n2, and the atomic concentration of the n-dipole elements in the treated first sub-layer 1401 at the n-region n2 is greater than an atomic concentration of the n-dipole elements in the treated first sub-layer 1401 at the n-region n3 (i.e., the atomic concentration of the n-dipole elements in the treated first sub-layer 1401: n1>n2>n3).

In some embodiments, the p-dipole elements in the treated first sub-layer 1401 at the p-region p1 have an atomic concentration that is greater than an atomic concentration of the p-dipole elements in the treated first sub-layer 1401 at the p-region p2, and the atomic concentration of the p-dipole elements in the treated first sub-layer 1401 at the p-region p2 is greater than an atomic concentration of the p-dipole elements in the treated first sub-layer 1401 at the p-region p3 (i.e., the atomic concentration of the p-dipole elements in the treated first sub-layer 1401: p1>p2>p3).

In some embodiments, the thermal drive-in process may be performed using a rapid thermal annealing (RTA) process, a furnace annealing process, a laser spike annealing process (LSA), or combinations thereof. Other suitable thermal annealing processes for facilitating diffusion of the n-dipole elements and the p-dipole elements are within the contemplated scope of the present disclosure. In some embodiments, the thermal drive-in process may be performed at a temperature ranging from about 500° C. to about 850° C. for a time period ranging from about 1 second to about 180 seconds. It is noted that the above process parameters may be adjusted according to different thermal processes to well control diffusion of the n-dipole elements and the p-dipole elements.

In some embodiments not shown herein, by controlling process parameters (for example, but not limited to, temperature and time period) of the thermal drive-in process, drive-in amounts of the n-dipole elements (or the p-dipole elements) and diffusion depth of the n-dipole elements (or the p-dipole elements) may be adjusted so as to obtain a desired concentration profile of the n-dipole elements (or the p-dipole elements) in the treated first sub-layer 1401 of each of the gate dielectric layers 141, 142, 143 and/or in the interfacial layers 131, 132, 133.

Referring to FIG. 34 which is a schematic view subsequent to FIG. 33, the n-dipole layer 71*n* at the n-region n1, the n-dipole layer 72*n* at each of the n-regions n1, n2, the p-dipole layer 71*p* at the p-region p1, and the p-dipole layer 72*p* at each of the p-regions p1, p2 (see FIG. 33) are removed by a wet etching process and/or a dry etching process.

The n-dipole layers 71*n*, 72*n* and the p-dipole layers 71*p*, 72*p* may be removed in a manner similar to the manner for removing the n-dipole layer 71*n* as described above with reference to FIGS. 25 and 26, and thus the details thereof are omitted for the sake of brevity.

Figure 16B:
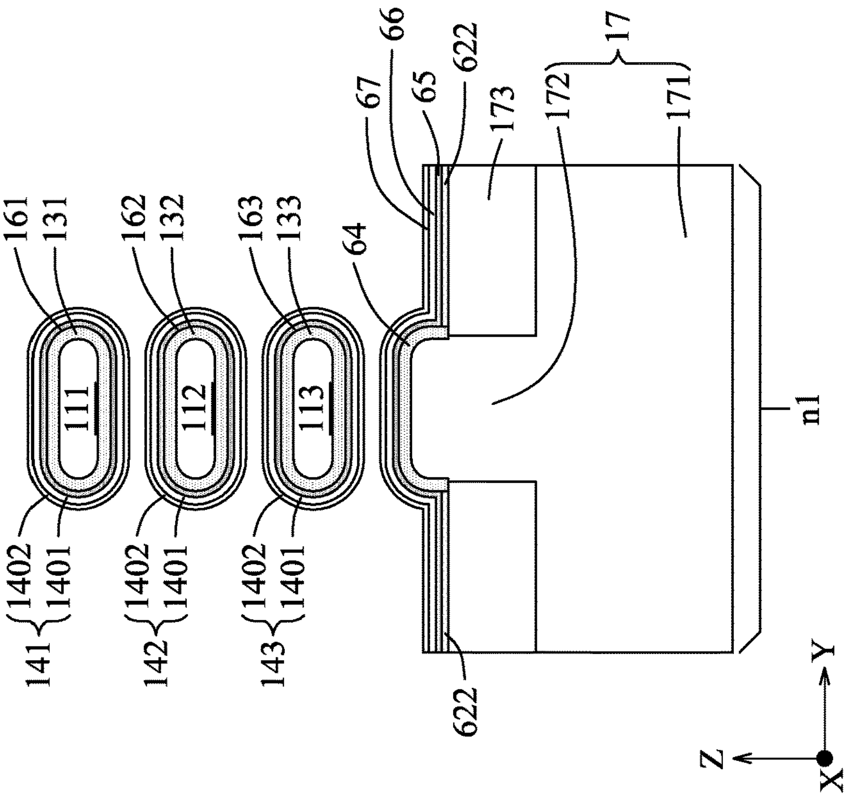
Figure 16A:
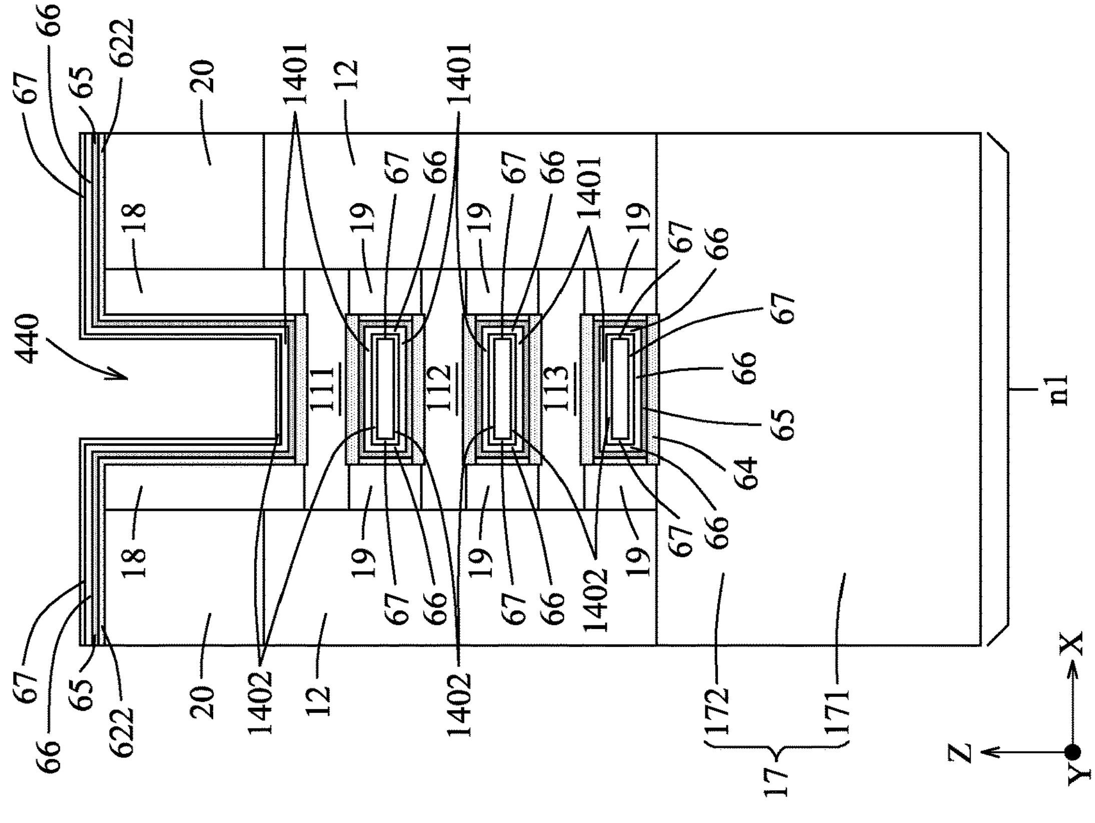
Figure 35:

Referring to FIG. 3 and the examples illustrated in FIGS. 16A, 16B and 35, the method 30 proceeds to step 313, where at each of the regions n1, n2, n3, p1, p2, p3, a second sub-layer 1402 of each of the gate dielectric layers 141, 142, 143 is formed on the treated first sub-layer 1401 of the corresponding one of the gate dielectric layers 141, 142, 143. After step 313, the gate dielectric layers 141, 142, 143 at each of the regions n1, n2, n3, p1, p2, p3 are thus obtained. FIGS. 16A and 16B are schematic sectional views respectively similar to FIGS. 15A and 15B, but illustrating the structures after step 313. FIG. 35 is a schematic view respectively similar to FIG. 34, but illustrating the structure after step 313.

In some embodiments, the second sub-layer 1402 of each of the gate dielectric layers 141, 142, 143 includes the second dielectric material as described above with reference to FIGS. 1A and 1B. In some embodiments, the second sub-layer 1402 of each of the gate dielectric layers 141, 142, 143 has a thickness ranging from about 4 Å to about 10 Å. In some embodiments, the second sub-layer 1402 of each of the gate dielectric layers 141, 142, 143 may formed using CVD, ALD or other suitable deposition techniques.

In some embodiments, the second sub-layer 1402 of each of the gate dielectric layers 141, 142, 143 is formed by conformally depositing the second dielectric material on the structure shown in FIGS. 15A and 15B. In such case, in addition to the treated first sub-layer 1401 of each of the gate dielectric layers 141, 142, 143 at each of the regions n1, n2, n3, p1, p2, p3, the second dielectric material may also cover the elements 66 to form portions 67.

Figure 17B:
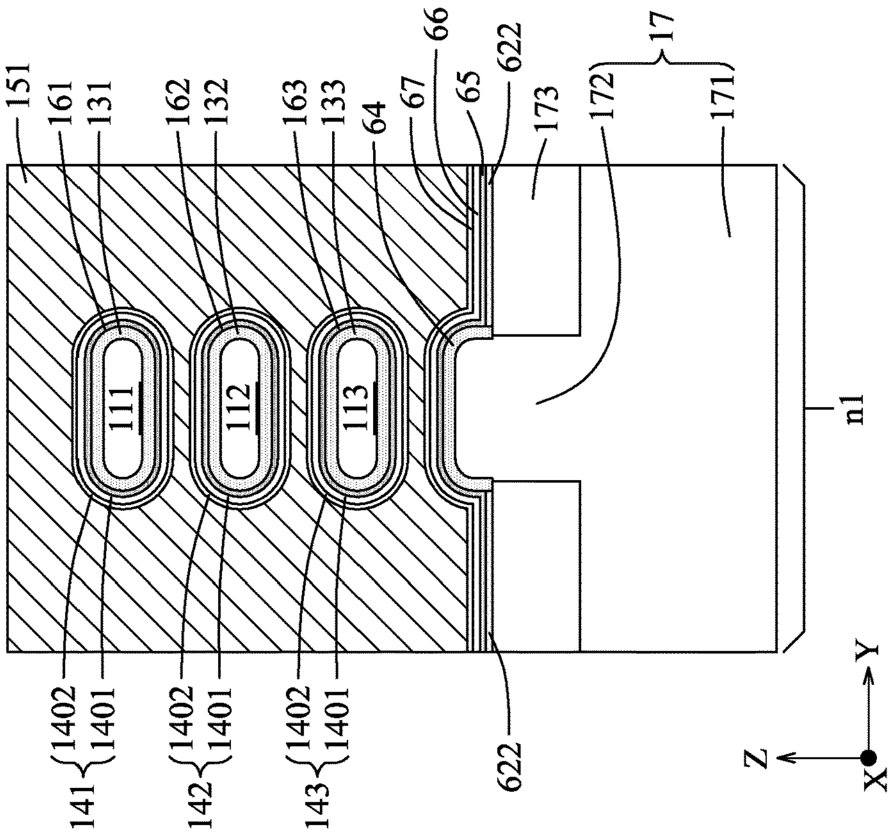
Figure 17A:
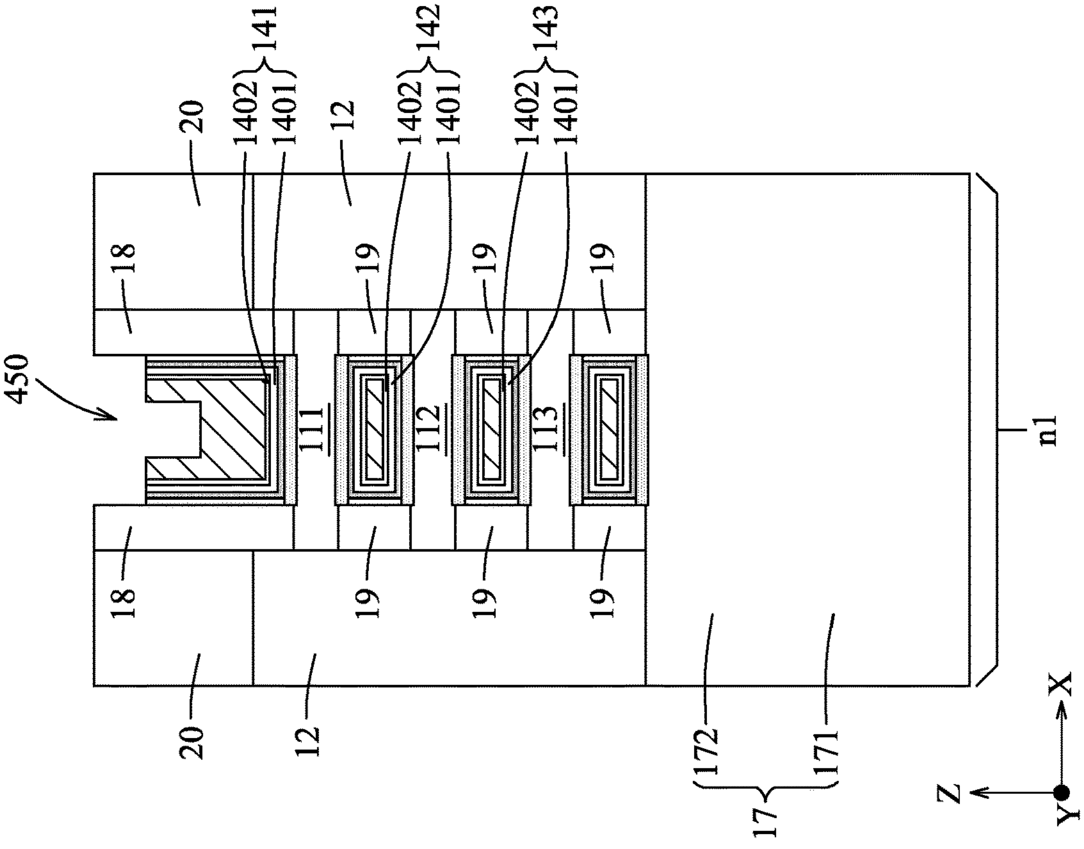
Figure 36:
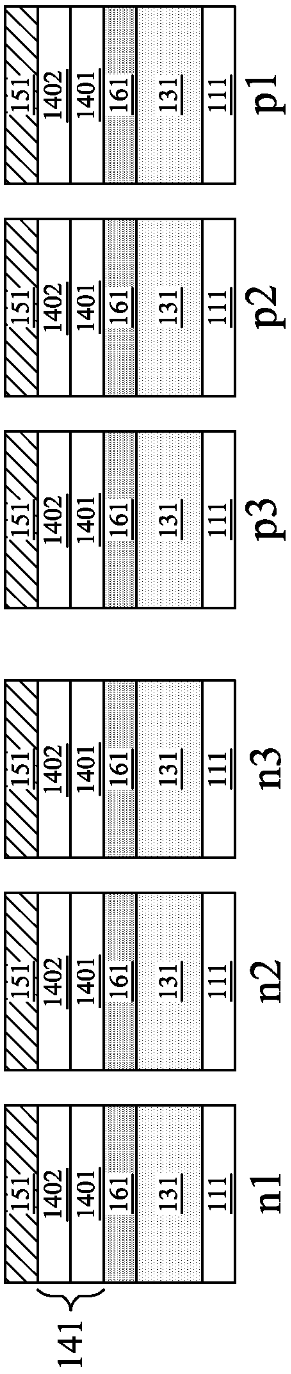

Referring to FIG. 3 and the examples illustrated in FIGS. 17A, 17B and 36, the method 30 proceeds to step 314, where at each of the regions n1, n2, n3, p1, p2, p3, the work-function portion 151 of the gate electrode 15 is formed around the gate dielectric layers 141, 142, 143. FIGS. 17A and 17B are schematic sectional views respectively similar to FIGS. 16A and 16B, but illustrating the structures after step 314. FIG. 36 is a schematic view respectively similar to FIG. 35, but illustrating the structure after step 314.

Since possible materials suitable for the work-function portion 151 have been described above with reference to FIGS. 1A and 1B, the details thereof are omitted herein for the sake of brevity. In some embodiments, the work-function portion 151 at each of the n-regions n1, n2, n3 may be made of a material different from that of the work-function portion 151 at each of the p-regions p1, p2, p3. For example, the work-function portion 151 at each of the n-regions n1, n2, n3 may be made of the n-band edge work-function material such as the examples described in the previous paragraph, and the work-function portion 151 at each of the p-regions p1, p2, p3 may be made of the p-band edge work-function material such as the examples described in the previous paragraph. In some embodiments, the work-function portion 151 at each of the n-regions n1, n2, n3 may be made of a material the same as that of the work-function portion 151 at each of the p-regions p1, p2, p3. For example, the work-function portion 151 at each of the regions n1, n2, n3, p1, p2, p3 may be made of the mid-gap work function material such as the examples described in the previous paragraph. In such case, in some embodiments, formation of the work-function portion 151 may include (i) forming depositing the mid-gap work function material for forming the work-function portion 151 to fill the cavity 440 (see FIGS. 16A and 16B) at each of the regions n1, n2, n3, p1, p2, p3 using PVD, CVD, ALD or other suitable deposition processes, followed by a planarization process to expose the two gate spacers 18 and the two ILD portions 20 at each of the regions n1, n2, n3, p1, p2, p3, and (ii) etching back the mid-gap work function material for forming the work-function portion 151 to form a groove 450 at each of the regions n1, n2, n3, p1, p2, p3 by an etching process, thereby obtaining the work-function portion 151 at each of the regions n1, n2, n3, p1, p2, p3. In some embodiments, during etching back of the mid-gap work function material for forming the work-function portion 151 at each of the regions n1, n2, n3, p1, p2, p3, the elements 622, 65, 66, 67 (see FIG. 16A) may also be partially etched away.

Figure 37:
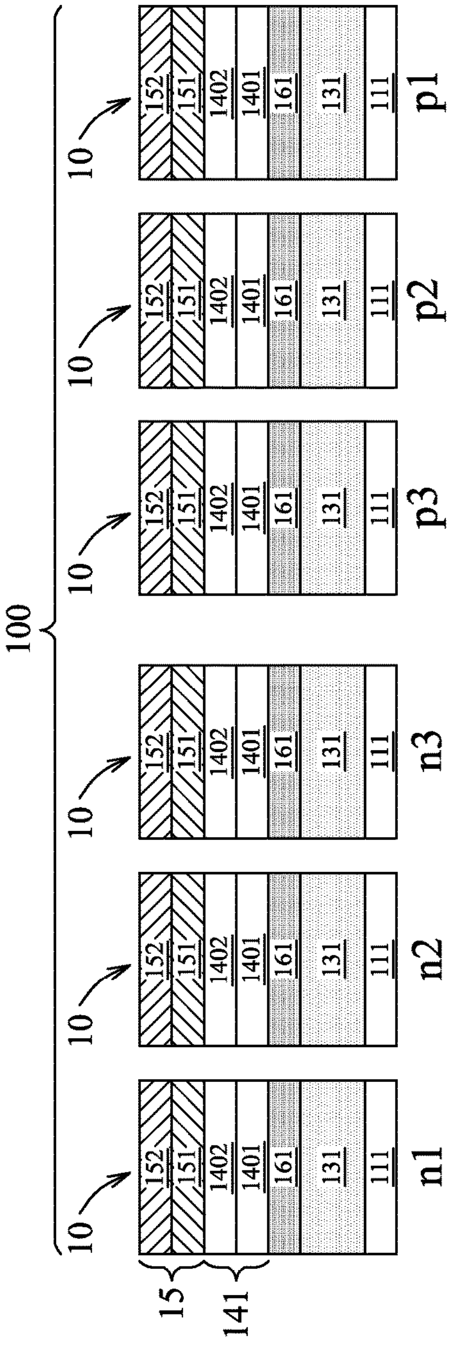

Referring to FIG. 3 and the examples illustrated in FIGS. 1A, 1B and 37, the method 30 proceeds to step 315, where at each of the regions n1, n2, n3, p1, p2, p3, the electrically conductive filling portion 152 of the gate electrode 15 is formed on the work-function portion 151 to fill the groove 450 (see FIG. 17A), thereby obtaining the gate electrode 15 at each of the regions n1, n2, n3, p1, p2, p3. After step 315, the semiconductor structure 10 including the semiconductor devices 10 respectively at the regions n1, n2, n3, p1, p2, p3 are thus obtained. FIGS. 1A and 1B are schematic sectional views respectively similar to FIGS. 17A and 17B, but illustrating the structures after step 315. FIG. 37 is a schematic view respectively similar to FIG. 36, but illustrating the structure after step 315.

Since possible materials suitable for the electrically conductive filling portion 152 have been described above with reference to FIGS. 1A and 1B, the details thereof are omitted herein for the sake of brevity. In some embodiments, formation of the electrically conductive filling portion 152 may include (i) depositing the materials for forming the electrically conductive filling portion 152 using PVD, CVD, ALD or other suitable deposition processes to fill the groove 450 at each of the regions n1, n2, n3, p1, p2, p3, and (ii) performing a planarization process (e.g., chemical mechanical polishing) or other suitable processes to expose the two gate spacers 18 and the two ILD portions 20 at each of the regions n1, n2, n3, p1, p2, p3, thereby obtaining the electrically conductive filling portion 152 of the gate electrode 15 at each of the regions n1, n2, n3, p1, p2, p3.

Referring to FIG. 37, the semiconductor devices 10 (one of which is shown in FIGS. 1A and 1B) at the n-regions n1, n2, n3 are n-FETs, and thus the threshold voltage (Vt) values thereof are positive. According to the atomic concentration of the n-dipole elements in the gate dielectric layers 141, 142, 143 at each of the regions n1, n2, n3 (i.e., the atomic concentration of the n-dipole elements in the treated first sub-layer 1401 of each of the gate dielectric layers 141, 142, 143: n1>n2>n3), the semiconductor device 10 at the n-region n1 would have a lower Vt value than that of the semiconductor device 10 at the n-region n2, and the semiconductor device 10 at the n-region n2 would have a lower Vt value than that of the semiconductor device 10 at the n-region n1 (i.e., the Vt value: n1<n2<n3).

The semiconductor devices 10 at the p-regions p1, p2, p3 are p-FETs, and thus the Vt values thereof are negative. According to the atomic concentration of the p-dipole elements in the gate dielectric layers 141, 142, 143 at each of the regions p1, p2, p3 (i.e., the atomic concentration of the p-dipole elements in the treated first sub-layer 1401 of each of the gate dielectric layers 141, 142, 143: p1>p2>p3), the semiconductor device 10 at the p-region p3 would have a lower Vt value than that of the semiconductor device 10 at the p-region p02 (i.e., the Vt value at the p-region p3 is more negative than that at the p-region p2), and the semiconductor device 10 at the p-region p2 would have a lower Vt value than that of the semiconductor device 10 at the p-region p3 (i.e., the Vt value at the p-region p2 is more negative than that at the p-region p1). That is, the Vt value: p3<p2<p1.

In some embodiments, the semiconductor structure 100 may further include additional features, and/or some features present in the semiconductor structure 100 may be modified, replaced, or eliminated without departure from the spirit and scope of the present disclosure. In some embodiments, some steps in the method 30 may be modified, replaced, or eliminated without departure from the spirit and scope of the present disclosure.

Figure 38:
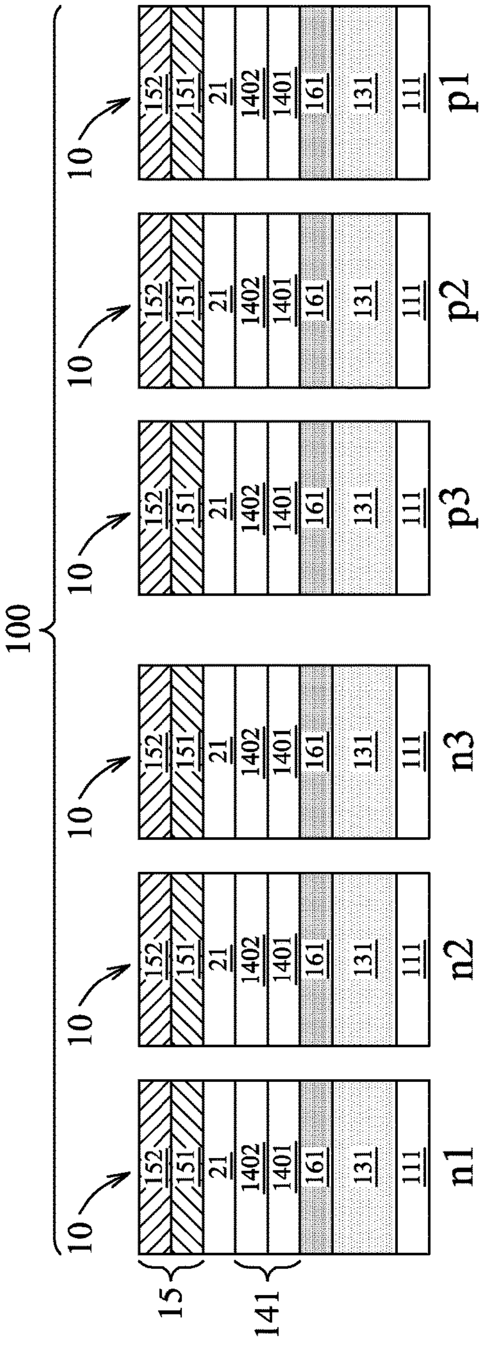

For example, in some embodiments, as shown in FIG. 38, each of the semiconductor devices 10 may further include a blocking layer 21 disposed to separate each of the gate dielectric layers 141, 142, 143 (only the gate dielectric layer 141 is schematically shown in FIG. 38) from the gate electrode 15. The blocking layer 21 serves to prevent oxygen in the gate dielectric layers 141, 142, 143 from diffusing into the gate electrode 15. As such, the metal elements in the gate electrode 15 may be prevented from being oxidized, thereby improving the reliability of the semiconductor devices 10. In some embodiments, the blocking layer 21 includes noble metal. For example, the blocking layer 21 includes gold (Au), platinum (Pt), iridium (Ir), palladium (Pd), osmium (Os), silver (Ag), rhodium (Rh), ruthenium (Ru), alloys thereof, or combinations thereof. In some embodiments, the blocking layer 21 has a thickness ranging from about 2 Å to about 10 Å. The blocking layer 21 may be formed after step 313 (see FIG. 35) and before step 314 (see FIG. 36) by PVD, CVD, ALD, or other suitable deposition techniques.

Figure 39:
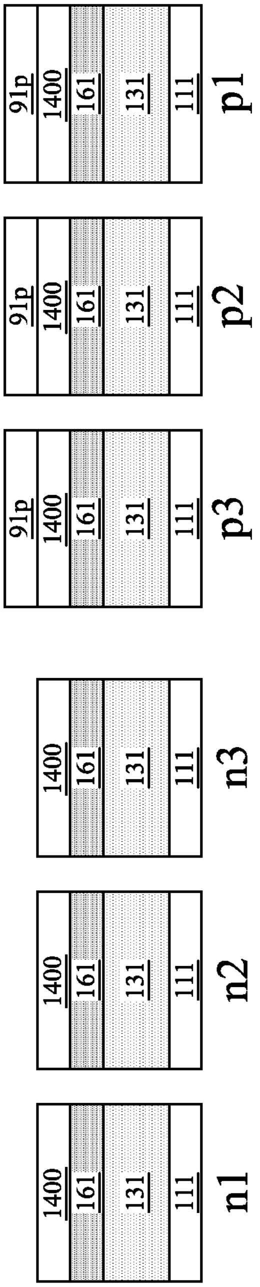
Figure 40:
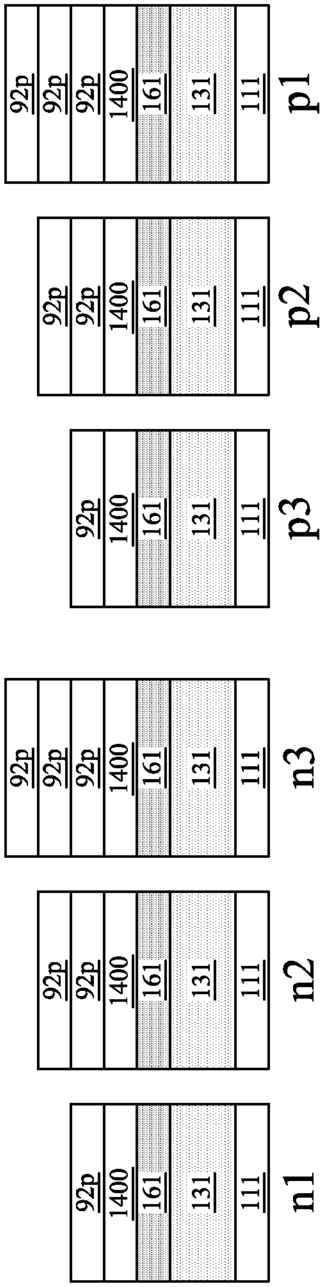

In some embodiments, the work-function portion 151 at each of the regions n1, n2, n3, p1, p2, p3 may be made of the same n-band edge work-function material. In order to obtain the relationship of the threshold voltage among the semiconductor devices 10 as described with reference to FIG. 37 (i.e., the Vt value: p3<p2<p1<0<n1<n2<n3), the p-dipole elements are used at each of the regions n1, n2, n3, p1, p2, p3 to adjust the threshold voltage of each of the semiconductor devices 10. Specifically, as shown in FIG. 39, a p-dipole layer 91*p* which includes the p-dipole elements is formed on the first sub-layer 1400 at each of the p-regions p1, p2, p3, and then the p-dipole elements in the p-dipole layer 91*p* are introduced in the first sub-layer 1400 at each of the p-regions p1, p2, p3 by a first thermal drive-in process. Afterwards, as shown in FIG. 40, the p-dipole layer 91*p* (see FIG. 39) at each of the p-regions p1, p2, p3 is removed, and then p-dipole layer(s) 92*p* are formed on the first sub-layer 1400 at each of the regions n1, n2, n3, p1, p2, p3. The number of the p-dipole layer(s) 92*p* at each of the regions n1, n2, n3, p1, p2, p3 may be the same or different from each other based on the required threshold voltage. Then, the p-dipole elements in the p-dipole layer(s) 92*p* are introduced in the first sub-layer 1400 at each of the regions n1, n2, n3, p1, p2, p3 by a second thermal drive-in process. After the second thermal drive-in process, the p-dipole layer(s) 92*p* at each of the regions n1, n2, n3, p1, p2, p3 are removed. In some embodiments, the p-dipole layer 91*p* may have a thickness that is greater than that of each of the p-dipole layers 92*p*. That is, deposition cycle time of ALD for forming the p-dipole layer 91*p* may be greater than that for each of the p-dipole layers 92*p*. In some embodiments, the p-dipole layer 91*p* may have a thickness ranging from about 5 Å to about 8 Å. In some embodiments, the p-dipole layer 92*p* may have a thickness ranging from about 2 Å to about 3 Å. The first and second thermal drive-in processes herein may be performed in a manner similar to that for the thermal drive-in process as described above with reference to FIG. 33, and thus the details are omitted for the sake of brevity. It is noted that process parameter(s) (e.g., temperature and time period) of each of the first and second thermal drive-in processes is tunable so as to permit the p-dipole elements to be driven to a desired position.

Figure 41:
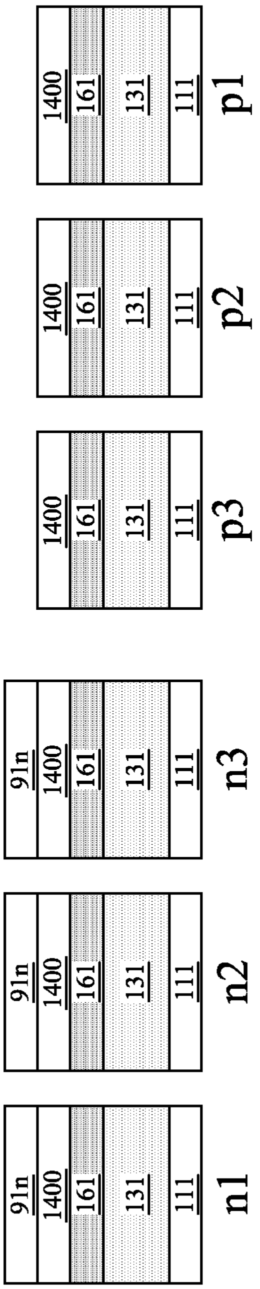
Figure 42:
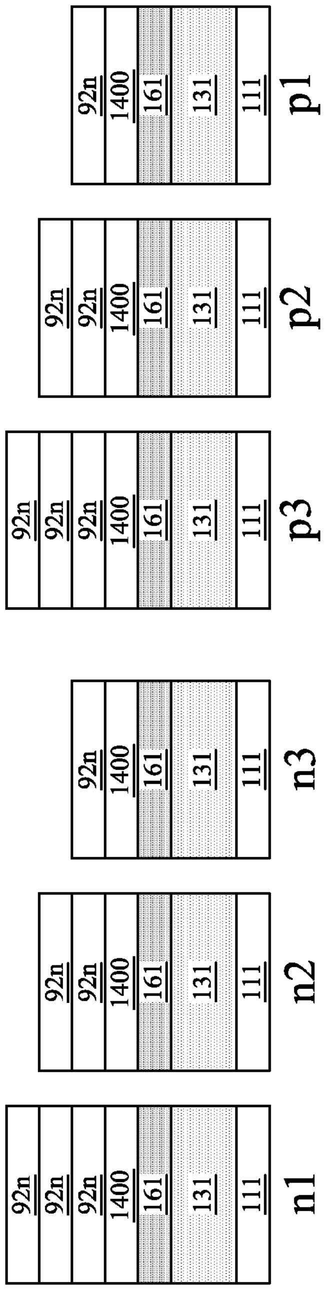

In some other embodiments, the work-function portion 151 at each of the regions n1, n2, n3, p1, p2, p3 may be made of the same p-band edge work-function material. In order to obtain the relationship of the threshold voltage among the semiconductor devices 10 as described with reference to FIG. 37 (i.e., the Vt value: p3<p2<p1<0<n1<n2<n3), the n-dipole elements at each of the regions n1, n2, n3, p1, p2, p3 are used to adjust the threshold voltage of each of the semiconductor devices 10. Specifically, as shown in FIG. 41, an n-dipole layer 91*n* which includes the n-dipole elements is formed on the first sub-layer 1400 at each of the n-regions n1, n2, n3, and then the n-dipole elements in the n-dipole layer 91*n* are introduced in the first sub-layer 1400 at each of the n-regions n1, n2, n3 by a third thermal drive-in process. Afterwards, as shown in FIG. 42, the n-dipole layer 91*n* at each of the n-regions n1, n2, n3 is removed, and then n-dipole layer(s) 92*n* are formed on the first sub-layer 1400 at each of the regions n1, n2, n3, p1, p2, p3. The number of the n-dipole layer(s) 92*n* at each of the regions n1, n2, n3, p1, p2, p3 may be the same or different from each other based on the required threshold voltage. Then, the n-dipole elements in the n-dipole layer(s) 92*n* are introduced in the first sub-layer 1400 at each of the regions n1, n2, n3, p1, p2, p3 by a fourth thermal drive-in process. After the fourth thermal drive-in process, the n-dipole layer(s) 92*n* at each of the regions n1, n2, n3, p1, p2, p3 are removed. In some embodiments, the n-dipole layer 91*n* may have a thickness that is greater than that of each of the n-dipole layers 92*n*. That is, deposition cycle time of ALD for forming the n-dipole layer 91*n* may be greater than that for each of the n-dipole layers 92*n*. In some embodiments, the n-dipole layer 91*n* may have a thickness ranging from about 5 Å to about 8 Å. In some embodiments, the n-dipole layer 92*n* may have a thickness ranging from about 2 Å to about 3 Å. The third and fourth thermal drive-in processes herein may be performed in a manner similar to that for the thermal drive-in process as described above with reference to FIG. 33, and thus the details are omitted for the sake of brevity. It is noted that process parameter(s) (e.g., temperature and time period) of each of the third and fourth thermal drive-in processes is tunable so as to permit the n-dipole elements to be driven to a desired position.

In summary, the interfacial layer in the semiconductor device of this disclosure includes rare-earth metal, and has a relatively high dielectric constant compared to silicon oxide. When the interfacial layer and a silicon oxide interfacial layer are compared under the same physical thickness, the interfacial layer may have a relatively small CET value. In addition, by selecting a rare-earth metal oxide, which has a specific relationship with a material of the channel portion in lattice constant, to serve as a material of the interfacial layer, less defects may be formed between the interface between the interfacial layer and the channel portion. Furthermore, with provision of the barrier layer which has a relatively high band gap energy and which is disposed between the interfacial layer and the gate electrode, an increase in gate current leakage of the semiconductor device is less likely to occur when the interfacial layer includes the rare-earth metal.

In accordance with some embodiments of the present disclosure, a method for manufacturing a semiconductor device includes: forming a channel portion which includes a semiconductor material; sequentially forming a first oxide film and a second oxide film on the channel portion, the first oxide film and the second oxide film being made of different materials, one of the first oxide film and the second oxide film including a rare-earth metal; performing a treatment such that the first oxide film and the second oxide film are formed into an interfacial layer which includes a first dielectric material and which is formed on the channel portion; forming a gate dielectric layer which includes a second dielectric material and which is formed on the interfacial layer, the second dielectric material being different from the first dielectric material; and forming a gate electrode on the gate dielectric layer such that the gate electrode is separated from the channel portion by the interfacial layer and the gate dielectric layer.

In accordance with some embodiments of the present disclosure, the rare-earth metal includes scandium (Sc), yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), or combinations thereof.

In accordance with some embodiments of the present disclosure, the first oxide film includes silicon oxide. The second oxide film includes a rare-earth metal oxide. The treatment includes a thermal process so as to permit the rare-earth metal oxide of the second oxide film to react with the silicon oxide of the first oxide film so as to form the first dielectric material.

In accordance with some embodiments of the present disclosure, the method further includes, after formation of the second oxide film and before the thermal process, forming a cap layer to cover the second oxide film, and removing the cap layer after the thermal process.

In accordance with some embodiments of the present disclosure, the cap layer includes silicon.

In accordance with some embodiments of the present disclosure, the second oxide film includes yttrium oxide, gadolinium oxide, cerium oxide, lanthanum oxide, lutetium oxide, or combinations thereof. The first dielectric material includes yttrium silicate, gadolinium silicate, cerium silicate, lanthanum silicate, lutetium silicate, or combinations thereof.

In accordance with some embodiments of the present disclosure, the second oxide film has a lattice constant that is an integer multiple of a lattice constant of the semiconductor material.

In accordance with some embodiments of the present disclosure, the semiconductor material includes silicon.

In accordance with some embodiments of the present disclosure, the first dielectric material has a dielectric constant that is greater than a dielectric constant of silicon oxide.

In accordance with some embodiments of the present disclosure, a method for manufacturing a semiconductor device includes: forming a channel portion; forming an interfacial layer which includes a first dielectric material and which is formed on the channel portion, the first dielectric material including a rare-earth metal; forming a gate dielectric layer which includes a second dielectric material and which is formed on the interfacial layer, the second dielectric material being different from the first dielectric material; introducing dipole elements into at least one of the interfacial layer and the gate dielectric layer in a predetermined amount such that the semiconductor device has a predetermined threshold voltage; and forming a gate electrode on the gate dielectric layer such that the gate electrode is separated from the channel portion by the interfacial layer and the gate dielectric layer.

In accordance with some embodiments of the present disclosure, the dipole elements include lanthanum (La), lutetium (Lu), scandium (Sc), yttrium (Y), thulium (Tm), gadolinium (Gd), aluminum (Al), zinc (Zn), gallium (Ga), or combinations thereof.

In accordance with some embodiments of the present disclosure, formation of the interfacial layer includes: sequentially forming a first oxide film and a second oxide film on the channel portion, the first oxide film and the second oxide film being made of different materials, one of the first oxide film and the second oxide film including the rare-earth metal; and performing a treatment such that the first oxide film and the second oxide film are formed into the interfacial layer.

In accordance with some embodiments of the present disclosure, the first oxide film includes silicon oxide. The second oxide film is made of a rare-earth metal oxide which includes scandium (Sc), yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), or combinations thereof. The first dielectric material is a rare-earth metal silicate which includes scandium (Sc), yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), or combinations thereof.

In accordance with some embodiments of the present disclosure, a semiconductor device includes: a channel portion; an interfacial layer which is disposed on the channel portion and which includes a first dielectric material, the first dielectric material including a rare-earth metal; a gate dielectric layer which is disposed on the interfacial layer and which includes a second dielectric material, the second dielectric material being different from the first dielectric material; and a gate electrode disposed on the gate dielectric layer such that the gate electrode is separated from the channel portion by the interfacial layer and the gate dielectric layer.

In accordance with some embodiments of the present disclosure, the first dielectric material has a dielectric constant that is greater than a dielectric constant of silicon oxide.

In accordance with some embodiments of the present disclosure, the first dielectric material is a rare-earth metal silicate which includes scandium (Sc), yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), or combinations thereof.

In accordance with some embodiments of the present disclosure, the semiconductor device further includes a barrier layer which is disposed between the interfacial layer and the gate dielectric layer, and which includes a barrier material. The barrier material has a conduction band edge energy that is greater than a conduction band edge energy of each of the first dielectric material and the second dielectric material, and a valence band edge energy that is lower than a valence band edge energy of each of the first dielectric material and the second dielectric material.

In accordance with some embodiments of the present disclosure, the barrier material includes aluminum oxide.

In accordance with some embodiments of the present disclosure, the semiconductor device further includes dipole elements present in at least one of the interfacial layer and the gate dielectric layer in a predetermined amount such that the semiconductor device has a predetermined threshold voltage.

In accordance with some embodiments of the present disclosure, the dipole elements include lanthanum (La), lutetium (Lu), scandium (Sc), yttrium (Y), thulium (Tm), gadolinium (Gd), aluminum (Al), zinc (Zn), gallium (Ga), or combinations thereof.

In accordance with some embodiments of the present disclosure, a method for manufacturing a semiconductor device includes: forming a channel portion which includes a semiconductor material; forming an interfacial layer which includes a first dielectric material and which is formed on the channel portion, the first dielectric material including a rare-earth metal; forming a barrier layer on the interfacial layer; forming a gate dielectric layer which includes a second dielectric material and which is formed on the barrier layer, the second dielectric material being different from the first dielectric material; and forming a gate electrode on the gate dielectric layer such that the gate electrode is separated from the channel portion by the interfacial layer, the barrier layer and the gate dielectric layer. The barrier layer includes a barrier material which has a conduction band edge energy that is greater than a conduction band edge energy of each of the first dielectric material and the second dielectric material, and a valence band edge energy that is lower than a valence band edge energy of each of the first dielectric material and the second dielectric material.

In accordance with some embodiments of the present disclosure, the barrier material includes aluminum oxide.

In accordance with some embodiments of the present disclosure, formation of the interfacial layer includes sequentially forming a first oxide film and a second oxide film on the channel portion, the first oxide film and the second oxide film being made of different materials, one of the first oxide film and the second oxide film including the rare-earth metal; performing a treatment such that the first oxide film and the second oxide film are formed into the interfacial layer.

In accordance with some embodiments of the present disclosure, the first oxide film includes silicon oxide. The second oxide film is made of a rare-earth metal oxide which includes scandium (Sc), yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), or combinations thereof. The first dielectric material is a rare-earth metal silicate which includes scandium (Sc), yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), or combinations thereof.

In accordance with some embodiments of the present disclosure, the treatment includes a thermal process which is performed at a temperature ranging from 850° C. to 1200° C.

In accordance with some embodiments of the present disclosure, the semiconductor material is silicon. The first oxide film is formed by oxidizing of a surface portion of the channel portion.

In accordance with some embodiments of the present disclosure, the semiconductor material is silicon. Formation of the first oxide film includes: forming a preformed silicon oxide layer by oxidizing of a surface portion of the channel portion; and thinning down the preformed silicon oxide layer.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:

forming a channel portion which includes a semiconductor material;

sequentially forming a first oxide film and a second oxide film on the channel portion, the first oxide film and the second oxide film being made of different materials, the second oxide film including praseodymium (Pr), neodymium (Nd), promethium (Pm), samarium (Sm), europium (Eu), terbium (Tb), dysprosium (Dy), holmium (Ho), erbium (Er), thulium (Tm), ytterbium (Yb), lutetium (Lu), or combinations thereof;

performing a treatment such that the first oxide film and the second oxide film are formed into an interfacial layer which includes a first dielectric material and which is formed on the channel portion;

forming a gate dielectric layer which includes a second dielectric material and which is formed on the interfacial layer, the second dielectric material being different from the first dielectric material; and forming a gate electrode on the gate dielectric layer such that the gate electrode is separated from the channel portion by the interfacial layer and the gate dielectric layer.

2. The method as claimed in claim 1, wherein the treatment includes a thermal process.

3. The method as claimed in claim 2, further comprising:

after formation of the second oxide film and before the thermal process, forming a cap layer to cover the second oxide film, and removing the cap layer after the thermal process.

4. The method as claimed in claim 3, wherein the cap layer includes silicon.

5. The method as claimed in claim 1, wherein the first oxide film includes silicon oxide, and the first dielectric material includes a metal silicate which includes praseodymium (Pr), neodymium (Nd), promethium (Pm), samarium (Sm), europium (Eu), terbium (Tb), dysprosium (Dy), holmium (Ho), erbium (Er), thulium (Tm), ytterbium (Yb), lutetium (Lu), or combinations thereof.

6. The method as claimed in claim 1, wherein the second oxide film has a lattice constant that is an integer multiple of a lattice constant of the semiconductor material.

7. The method as claimed in claim 6, wherein the semiconductor material includes silicon.

8. The method as claimed in claim 1, wherein the first dielectric material has a dielectric constant that is greater than a dielectric constant of silicon oxide.

9. The method as claimed in claim 1, wherein formation of the first oxide film includes forming a preformed oxide layer on the channel portion, and thinning down the preformed oxide layer to form the first oxide film.

10. The method as claimed in claim 9, wherein the preformed oxide layer is formed by a wet chemical oxidation process.

11. The method as claimed in claim 1, wherein the first oxide film is formed by subjecting the channel portion to an oxygen plasma such that a surface portion of the channel portion is oxidized to form the first oxide film.

12. A method for manufacturing a semiconductor device, comprising:

forming a channel portion;

subjecting the channel portion to an oxygen plasma such that a surface portion of the channel portion is oxidized to form a first oxide film;

forming a second oxide film on the first oxide film, the first oxide film and the second oxide film being made of different materials;

performing a treatment such that the first oxide film and the second oxide film are formed into an interfacial layer which includes a first dielectric material and which is formed on the channel portion;

forming a gate dielectric layer which includes a second dielectric material and which is formed on the interfacial layer, the second dielectric material being different from the first dielectric material;

introducing dipole elements into one of the interfacial layer and the gate dielectric layer in a predetermined amount such that the semiconductor device has a predetermined threshold voltage; and forming a gate electrode on the gate dielectric layer such that the gate electrode is separated from the channel portion by the interfacial layer and the gate dielectric layer.

13. The method as claimed in claim 12, wherein the dipole elements include lanthanum (La), lutetium (Lu), scandium (Sc), yttrium (Y), thulium (Tm), gadolinium (Gd), aluminum (Al), zinc (Zn), gallium (Ga), or combinations thereof.

14. The method as claimed in claim 12, wherein the first oxide film includes silicon oxide, and has a thickness ranging from 4 Å to 7 Å, the second oxide film is made of a rare-earth metal oxide which includes scandium (Sc), yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), or combinations thereof, the second oxide film having a thickness ranging from 3 Å to 10 Å, the first dielectric material is a rare-earth metal silicate which includes scandium (Sc), yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), or combinations thereof, and the silicon oxide of the first oxide film is reacted completely with the rare-earth metal oxide of the second oxide film to form the interfacial layer that does not include the silicon oxide.

15. A semiconductor device, comprising:

a channel portion;

an interfacial layer which is disposed on the channel portion and which includes a first dielectric material, the first dielectric material including a rare-earth metal;

a gate dielectric layer which is disposed on the interfacial layer and which includes a second dielectric material, the second dielectric material being different from the first dielectric material;

a barrier layer which is disposed between the interfacial layer and the gate dielectric layer, and which includes a barrier material, the barrier material having a conduction band edge energy that is greater than a conduction band edge energy of each of the first dielectric material and the second dielectric material, and a valence band edge energy that is lower than a valence band edge energy of each of the first dielectric material and the second dielectric material; and a gate electrode disposed on the gate dielectric layer such that the gate electrode is separated from the channel portion by the interfacial layer, the gate dielectric layer, and the barrier layer.

16. The semiconductor device as claimed in claim 15, wherein the first dielectric material has a dielectric constant that is greater than a dielectric constant of silicon oxide.

17. The semiconductor device as claimed in claim 15, wherein the first dielectric material is a rare-earth metal silicate which includes scandium (Sc), yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), or combinations thereof.

18. The semiconductor device as claimed in claim 15, wherein the barrier material includes aluminum oxide.

19. The semiconductor device as claimed in claim 15, further comprising dipole elements present in at least one of the interfacial layer and the gate dielectric layer in a predetermined amount such that the semiconductor device has a predetermined threshold voltage.

20. The semiconductor device as claimed in claim 19, wherein the dipole elements include lanthanum (La), lutetium (Lu), scandium (Sc), yttrium (Y), thulium (Tm), gadolinium (Gd), aluminum (Al), zinc (Zn), gallium (Ga), or combinations thereof.

* * * * *